United States Patent
Takahashi et al.

(10) Patent No.: US 12,401,185 B2
(45) Date of Patent: Aug. 26, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Naoki Takahashi, Kanagawa (JP); Akio Ogura, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 171 days.

(21) Appl. No.: 18/117,566

(22) Filed: Mar. 6, 2023

(65) Prior Publication Data

US 2023/0387678 A1    Nov. 30, 2023

(30) Foreign Application Priority Data

May 26, 2022  (JP) ................. 2022-086200

(51) Int. Cl.
*H02H 5/04* (2006.01)
*G01K 3/00* (2006.01)
*G01R 19/00* (2006.01)
*G01R 31/28* (2006.01)
*H02H 1/00* (2006.01)

(52) U.S. Cl.
CPC ............ *H02H 5/04* (2013.01); *G01K 3/005* (2013.01); *G01R 19/0038* (2013.01); *G01R 31/2851* (2013.01); *H02H 1/0007* (2013.01)

(58) Field of Classification Search
CPC ............... H02H 5/04–048; G01R 31/00–74
See application file for complete search history.

(56) References Cited

U.S. PATENT DOCUMENTS

| | | | |
|---|---|---|---|
| 5,220,534 | A | 6/1993 | Loh |
| 6,581,171 | B1 | 6/2003 | Krause |
| 2006/0104001 | A1* | 5/2006 | Yoshio ............... H02H 3/085 |
| | | | 361/103 |
| 2008/0192390 | A1 | 8/2008 | Yoshida |

(Continued)

FOREIGN PATENT DOCUMENTS

| | | |
|---|---|---|
| JP | H06-124130 A | 5/1994 |
| JP | H08-016263 A | 1/1996 |

(Continued)

OTHER PUBLICATIONS

Notice of Reasons for Refusal mailed Jun. 3, 2025 in corresponding Japanese Patent Application No. 2022-086200, 6 pages.

*Primary Examiner* — Jared Fureman
*Assistant Examiner* — Christopher J Clark
(74) *Attorney, Agent, or Firm* — Kim & Stewart LLP

(57) ABSTRACT

According to one embodiment, a semiconductor device includes, a first terminal, a second terminal, a third terminal, a first circuit configured to output a first signal of a first level if a temperature satisfies a condition, and a second circuit configured, if the first circuit outputs the first signal of the first level, to provide electrical insulation between the second terminal and the third terminal, wherein the first circuit includes an element provided between a first interconnect and the first terminal, and the first circuit outputs the first signal of the first level regardless of the temperature if a first voltage is supplied to the first interconnect.

12 Claims, 15 Drawing Sheets

(56) References Cited

U.S. PATENT DOCUMENTS

| | | |
|---|---|---|
| 2011/0001517 A1 | 1/2011 | Takano |
| 2016/0003688 A1* | 1/2016 | Luber ................... H02H 5/04 |
| | | 361/103 |
| 2018/0076613 A1* | 3/2018 | Kume ................... H02H 5/041 |

FOREIGN PATENT DOCUMENTS

| | | |
|---|---|---|
| JP | 3294811 B2 | 6/2002 |
| JP | 3355571 B2 | 12/2002 |
| JP | 3490661 B2 | 1/2004 |
| JP | 2008-196885 A | 8/2008 |
| JP | 2011-013877 A | 1/2011 |
| JP | 2015-076510 A | 4/2015 |
| JP | 2016-206040 A | 12/2016 |
| JP | 2019-204985 A | 11/2019 |

* cited by examiner

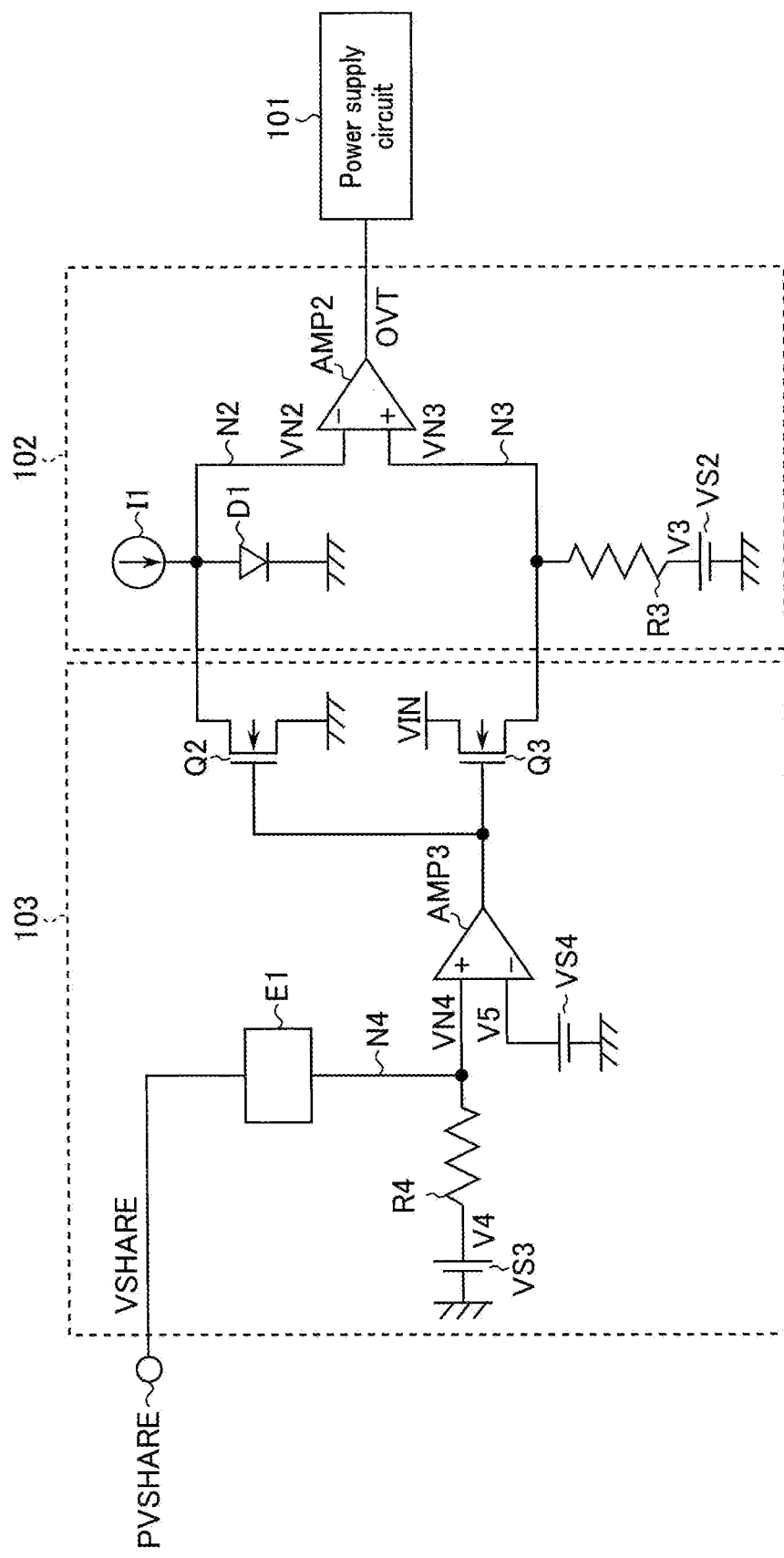
F I G. 3

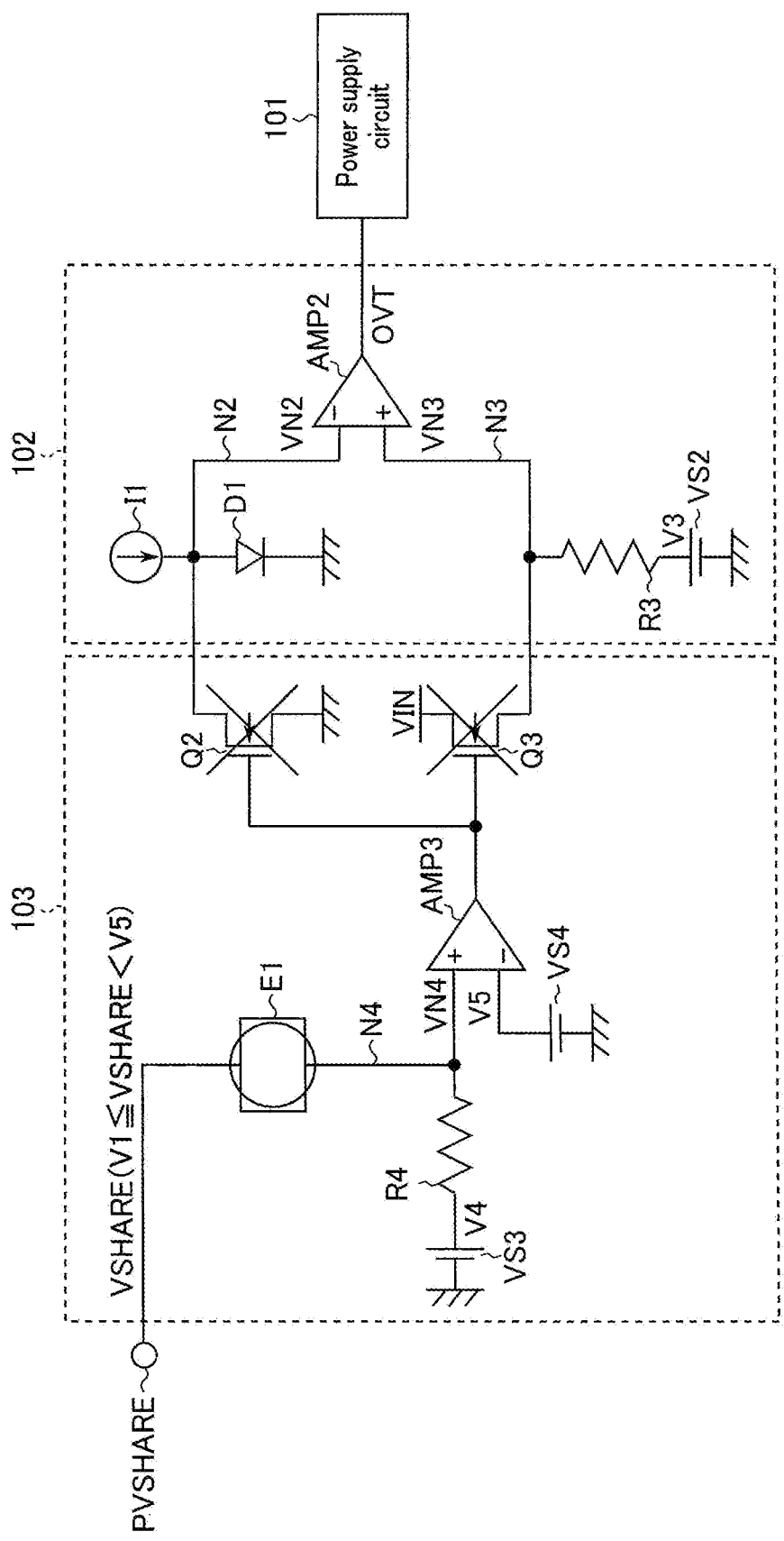
F I G. 7

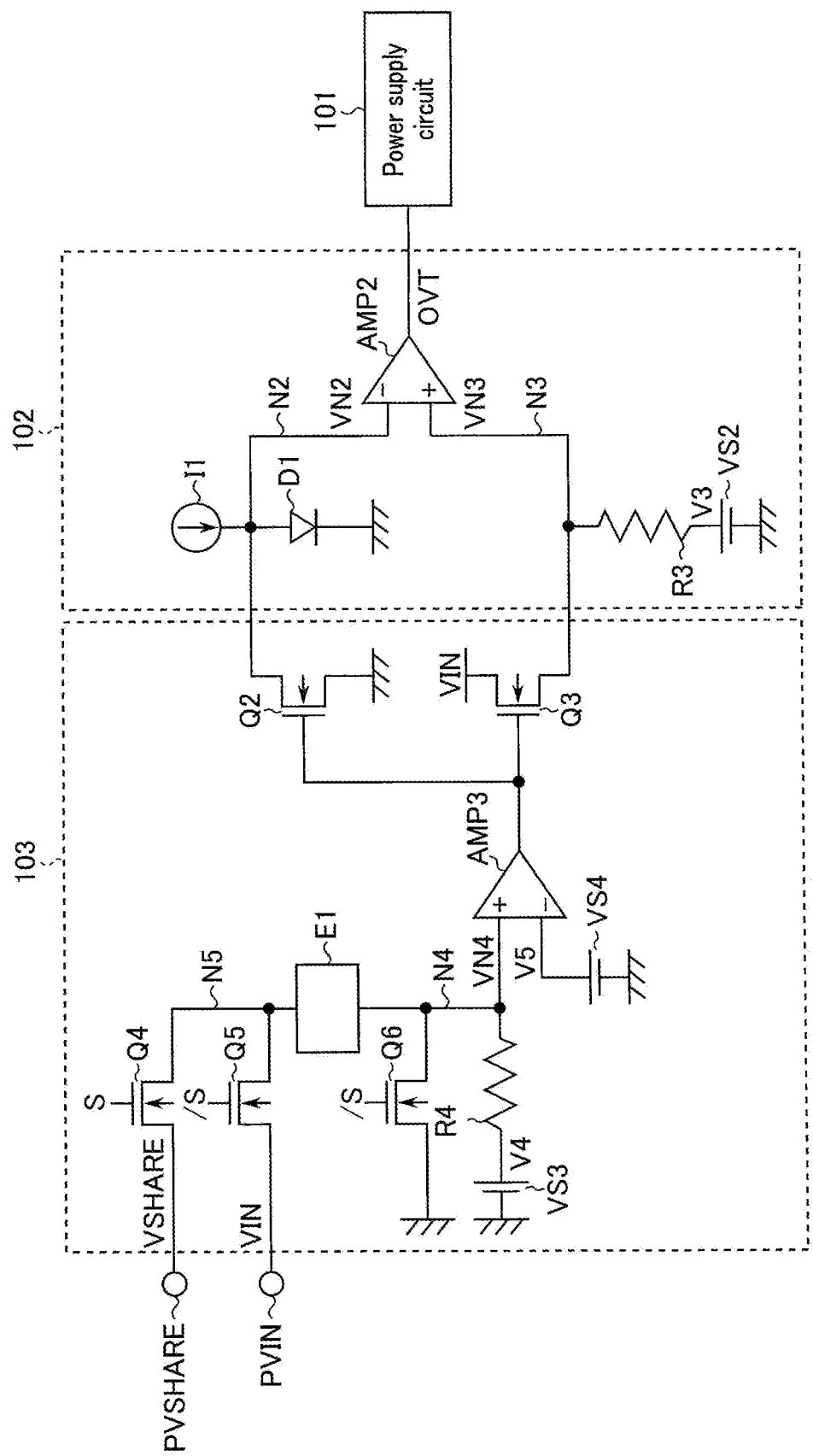
F I G. 8

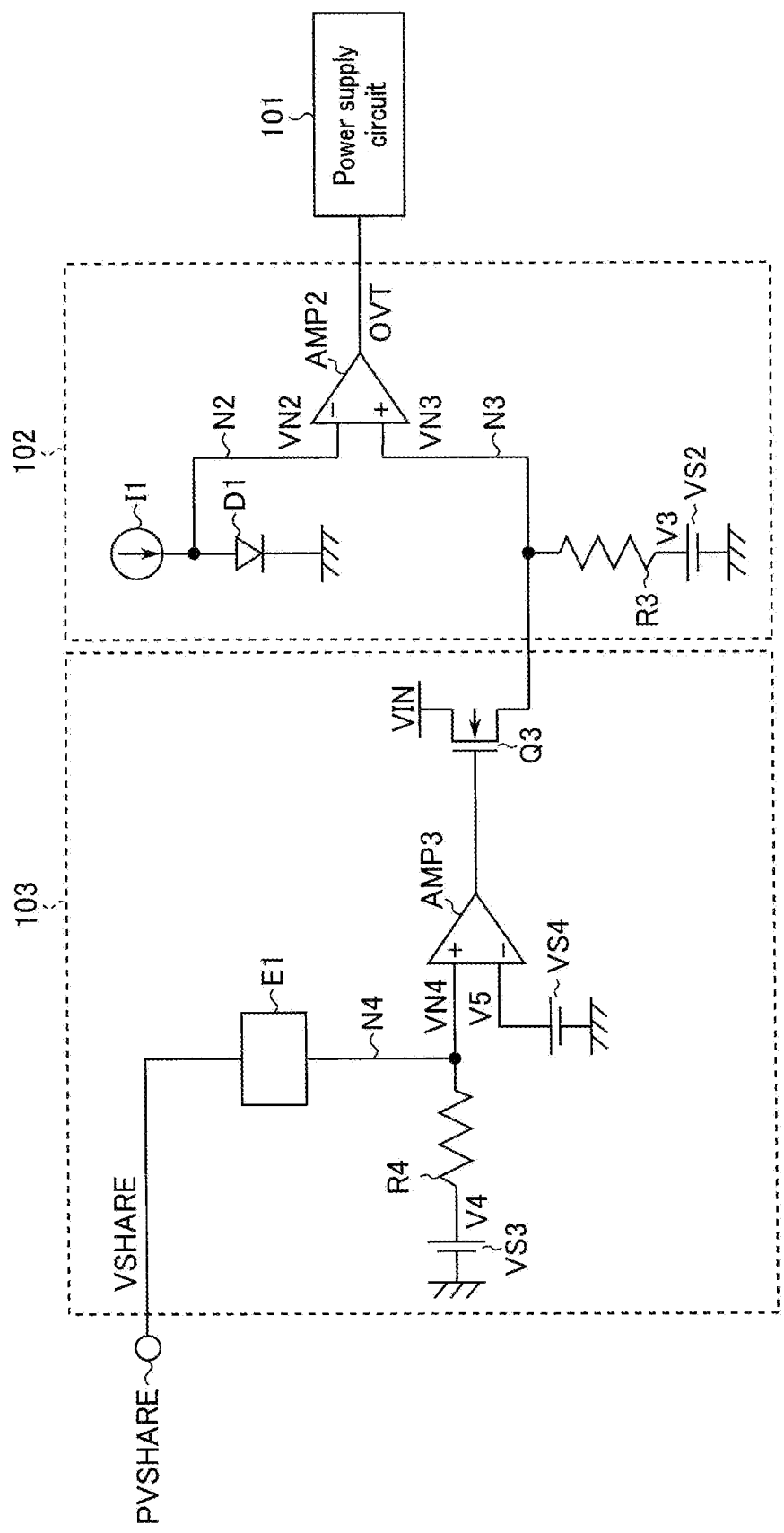
F I G. 9

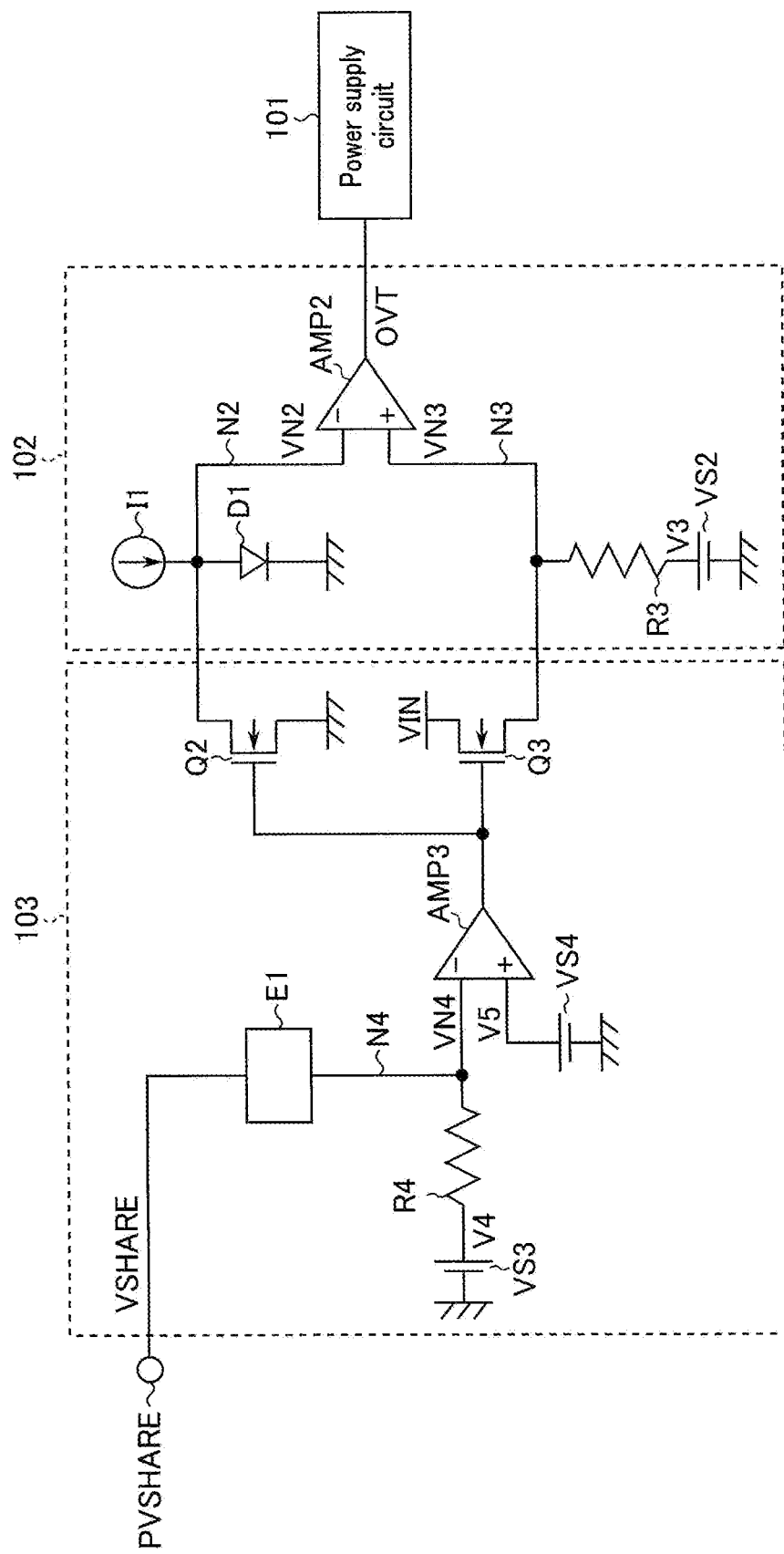
F I G. 12

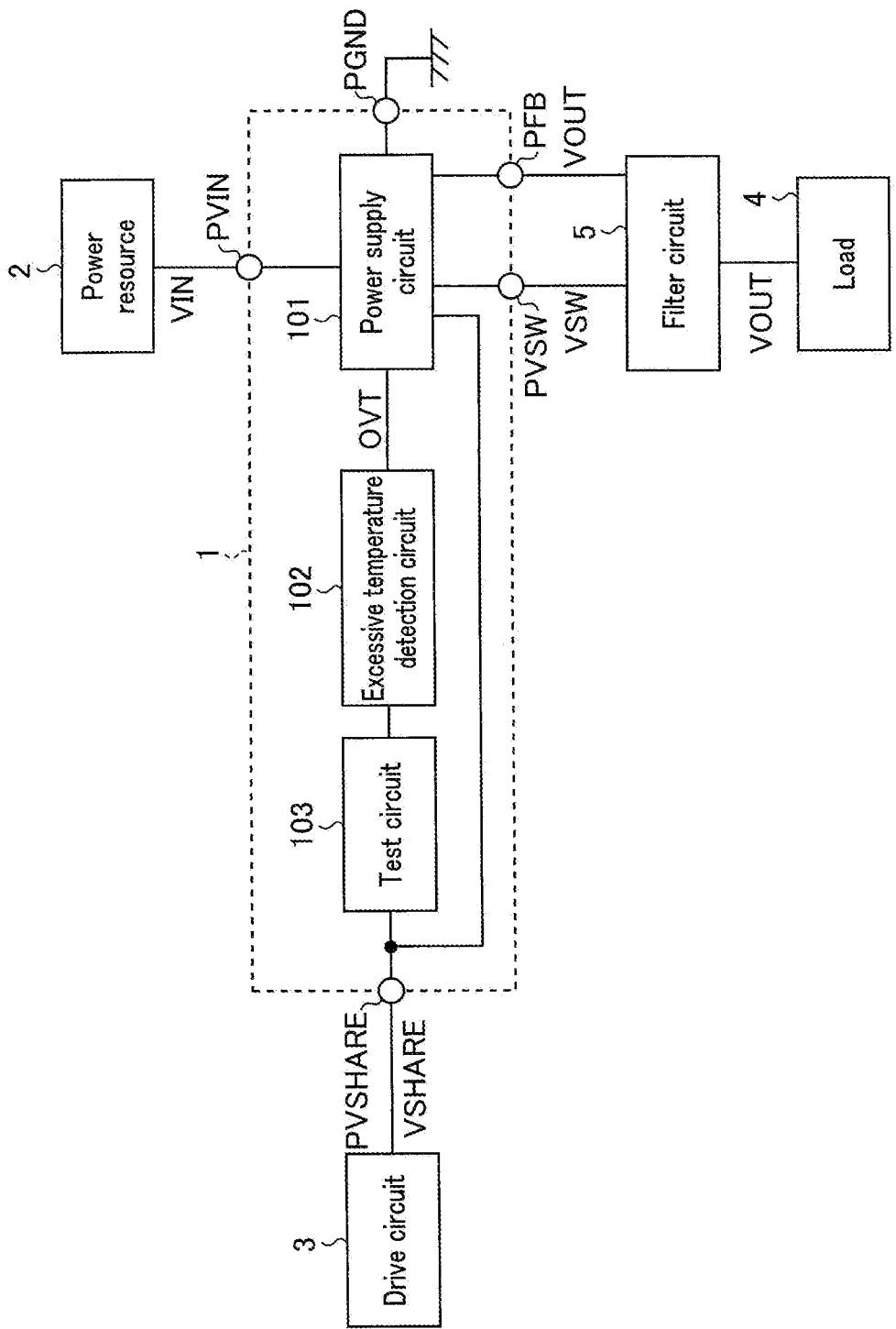
F I G. 14

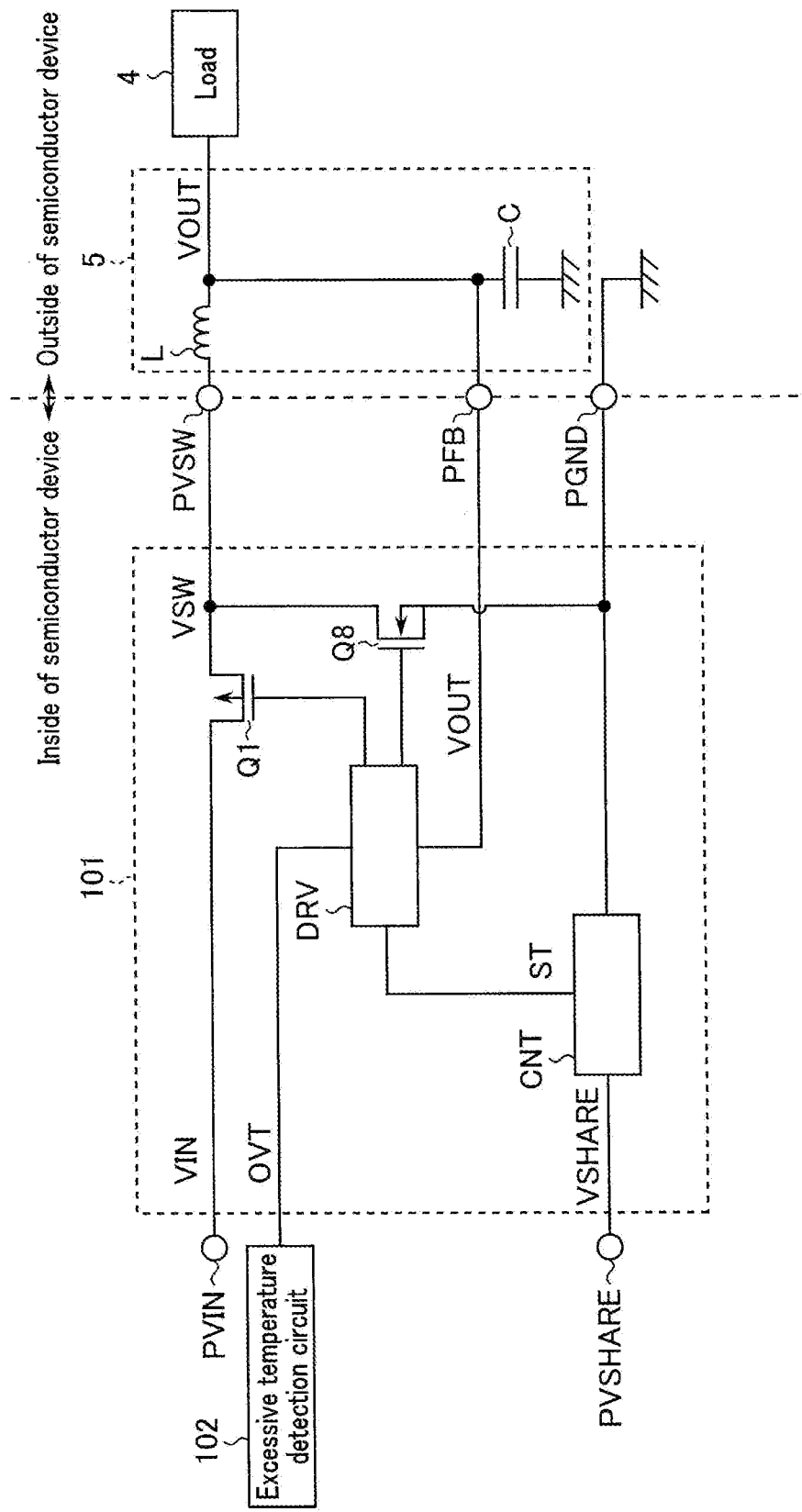
F I G. 15

SEMICONDUCTOR DEVICE

CROSS-REFERENCE TO RELATED APPLICATIONS

This application is based upon and claims the benefit of priority from Japanese Patent Application No. 2022-086200, filed May 26, 2022, the entire contents of which are incorporated herein by reference.

FIELD

Embodiments described herein relate generally to a semiconductor device.

BACKGROUND

A semiconductor device configured to protect peripheral devices from an excessive increase in temperature by stopping supply of the electric power is known. Such a semiconductor device includes a test circuit for determining whether or not supply of the electric power has been stopped in a normal manner.

BRIEF DESCRIPTION OF THE DRAWINGS

FIG. 3 is a circuit diagram illustrating an example of a configuration of an excessive temperature detection circuit and a test circuit according to the embodiment.

FIG. 7 is a circuit diagram illustrating an example of a configuration of an excessive temperature detection circuit and a test circuit for illustrating a normal operation in a second operation example of the embodiment.

FIG. 8 is a circuit diagram illustrating an example of a configuration of an excessive temperature detection circuit and a test circuit according to a first modification.

FIG. 9 is a circuit diagram illustrating an example of a configuration of an excessive temperature detection circuit and a test circuit according to a second modification.

FIG. 12 is a circuit diagram illustrating an example of a configuration of an excessive temperature detection circuit and a test circuit according to a fifth modification.

FIG. 14 is a block diagram showing an example of a configuration of a power supply system including a semiconductor device according to a seventh modification.

FIG. 15 is a circuit diagram illustrating an example of a configuration of a power supply circuit and a filter circuit according to the seventh modification.

DETAILED DESCRIPTION

Figure 1:
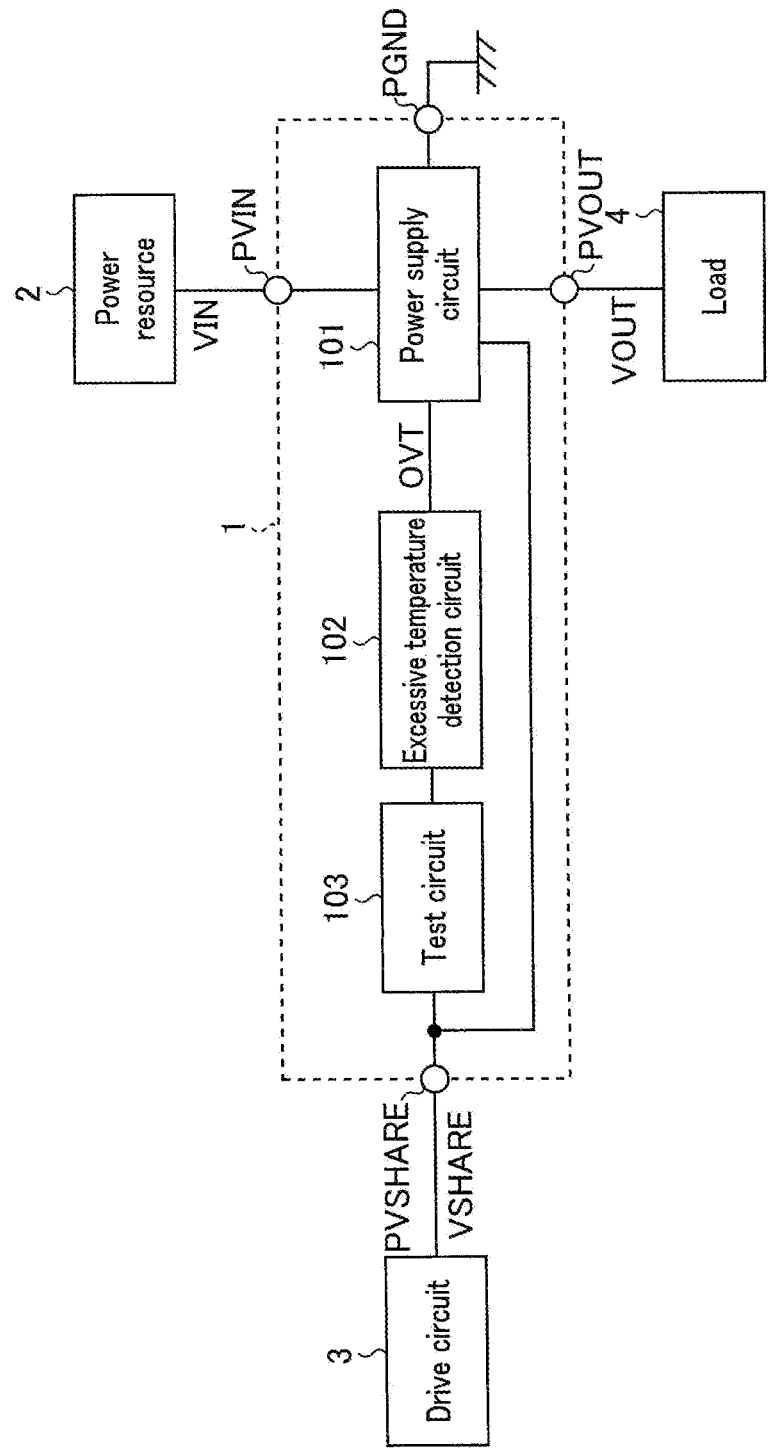
FIG. 1 is a block diagram showing an example of a configuration of a power supply system including a semiconductor device according to an embodiment.

In general, according to one embodiment, a semiconductor device includes, a first terminal, a second terminal, a third terminal, a first circuit configured to output a first signal of a first level if a temperature satisfies a condition, and a second circuit driven by a voltage supplied via the first terminal and configured, if the first circuit outputs the first signal of the first level, to provide electrical insulation between the second terminal and the third terminal, wherein the first circuit includes an element provided between a first interconnect and the first terminal, and the first circuit outputs the first signal of the first level regardless of the temperature if a first voltage is supplied to the first interconnect.

Hereinafter, embodiments will be described with reference to the drawings. In the description that follows, components having an identical function and configuration will be assigned a common reference numeral.

1. Embodiment

Hereinafter, a description will be given of a semiconductor device according to an embodiment.

1. 1 Configuration

1. 1. 1 Power Supply System

A configuration of a power supply system including the semiconductor device according to the embodiment will be described with reference to FIG. 1. FIG. 1 is a block diagram showing an example of a configuration of the power supply system including the semiconductor device according to the embodiment. The power supply system includes a semiconductor device 1, a power source 2, a drive circuit 3, and a load 4.

The semiconductor device 1 is, for example, an integrated circuit (IC) chip. The semiconductor device 1 outputs a voltage VOUT to the load 4 based on a voltage VIN supplied from the power source 2.

The semiconductor device 1 includes terminals PGND, PVIN, PVOUT, and PVSHARE.

The terminal PGND is a ground terminal. A voltage VSS is supplied to the terminal PGND. The voltage VSS is a ground voltage. The voltage VSS is, for example, 0 V.

The terminal PVIN is coupled to the power source 2. The voltage VIN is supplied to the terminal PVIN from the power source 2. The voltage VIN is a voltage greater than the voltage VSS.

The terminal PVSHARE is coupled to the drive circuit 3. The drive circuit 3 is an external circuit used for driving the semiconductor device 1, a tester used for determining whether or not the power supply has been stopped in a normal manner in the case of an excessive increase in the temperature of the semiconductor device 1, or the like. A voltage VSHARE is supplied to the terminal PVSHARE from the drive circuit 3. The voltage VSHARE is a voltage used for driving the semiconductor device 1 and for determining whether or not the power supply has been stopped in a normal manner.

The terminal PVOUT is coupled to the load 4. A voltage VOUT is supplied from the terminal PVOUT to the load 4.

1. 1. 2 Semiconductor Device

A configuration of the semiconductor device 1 according to the embodiment will be further described with reference to FIG. 1.

The semiconductor device 1 includes a power supply circuit 101, an excessive temperature detection circuit 102, and a test circuit 103.

The power supply circuit 101 is coupled to the excessive temperature detection circuit 102 and the terminals PVIN, PVSHARE, PVOUT, and PGND. A signal OVT is supplied to the power supply circuit 101 from the excessive temperature detection circuit 102. The voltage VSHARE is supplied to the power supply circuit 101 via the terminal PVSHARE. The power supply circuit 101 is brought to an enabled state while the voltage VSHARE is at a "high" ("H") level. The H-level voltage VSHARE is, for example, equal to or greater than a voltage V1. The power supply circuit 101 in an enabled state supplies the voltage VOUT based on the voltage VIN, on the basis of the signal OVT from the excessive temperature detection circuit 102. The power supply circuit 101 is brought to a disabled state while the voltage VSHARE is at a "low" ("L") level. The L-level voltage VSHARE is, for example, smaller than the voltage V1. The power supply circuit 101 in a disabled state stops supplying the voltage VOUT based on the voltage VIN, regardless of the signal OVT from the excessive temperature detection circuit 102.

The excessive temperature detection circuit 102 detects whether or not the temperature of the semiconductor device 1 is equal to or greater than a threshold temperature T1. The threshold temperature T1 is, for example, a temperature on the order of 200° C. The excessive temperature detection circuit 102 supplies the signal OVT to the power supply circuit 101 based on the detection result. More specifically, the excessive temperature detection circuit 102 supplies the signal OVT to the power supply circuit 101 in such a manner that the supplying of the voltage VOUT based on the voltage VIN is stopped upon detecting, for example, that the temperature of the semiconductor device 1 is equal to or greater than the threshold temperature T1. Also, the excessive temperature detection circuit 102 supplies the signal OVT to the power supply circuit 101 in such a manner that the voltage VOUT based on the voltage VIN is supplied upon detecting, for example, that the temperature of the semiconductor device 1 is lower than the threshold temperature T1.

The test circuit 103 is coupled to the terminal PVSHARE. The test circuit 103 controls, based on the voltage VSHARE, the excessive temperature detection circuit 102 to determine whether or not the excessive temperature detection circuit 102 is operating in a normal manner. Hereinafter, an operation of determining whether or not the excessive temperature detection circuit 102 is operating in a normal manner will be referred to as a "test operation". Details of the test operation will be described later.

1. 1. 2. 1 Configuration of Power Supply Circuit

Figure 2:
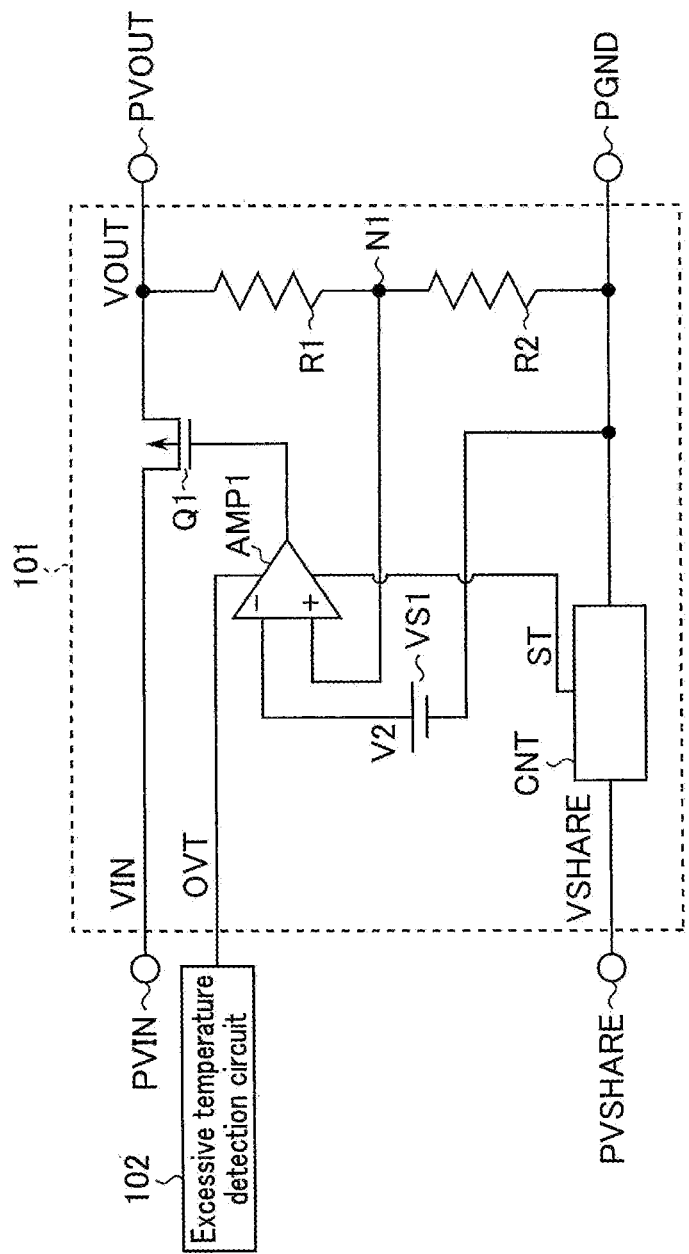
FIG. 2 is a circuit diagram illustrating an example of a configuration of a power supply circuit according to the embodiment.

An example of a configuration of the power supply circuit 101 according to the embodiment will be described with reference to FIG. 2. FIG. 2 is a circuit diagram illustrating an example of a configuration of the power supply circuit according to the embodiment. The power supply circuit 101 in the embodiment is a low dropout (LDO) regulator.

The power supply circuit 101 includes a switching element Q1, resistances R1 and R2, an error amplifier AMP1, a constant-voltage source VS1, and a control circuit CNT. The switching element Q1 is a P-type metal-oxide-semiconductor field-effect transistor (MOSFET).

A first end of the switching element Q1 is coupled to the terminal PVIN. A gate of the switching element Q1 is coupled to the error amplifier AMP1. A second end of the switching element Q1 is coupled to the terminal PVOUT.

A first end of the resistance R1 is coupled to the terminal PVOUT. A second end of the resistance R1 is coupled to a node N1.

A first end of the resistance R2 is coupled to the node N1. A second end of the resistance R2 is coupled to the terminal PGND.

With the above-described configuration of the resistances R1 and R2, the voltage VN1 of the node N1 becomes a fractional voltage of the voltage VOUT determined based on a ratio of values of the resistances R1 and R2.

A first end of the constant-voltage source VS1 is coupled to the error amplifier AMP1. A voltage V2 is supplied to the error amplifier AMP1 from the first end of the constant-voltage source VS1. A second end of the constant-voltage source VS1 is coupled to the terminal PGND.

The control circuit CNT includes a first end, a second end, and a third end. The first end is coupled to the terminal PVSHARE. The second end is coupled to the error amplifier AMP1. The third end is coupled to the terminal PGND. A signal ST based on the voltage VSHARE is supplied to the error amplifier AMP1 from the second end of the control circuit CNT. More specifically, the control circuit CNT supplies an H-level signal ST to the error amplifier AMP1 to bring the power supply circuit 101 to an enabled state while the voltage VSHARE is at the H level. Also, the control circuit CNT supplies an L-level signal ST to the error amplifier AMP1 to bring the power supply circuit 101 to a disabled state while the voltage VSHARE is at the L level.

The error amplifier AMP1 includes a non-inversion input terminal (+), an inversion input terminal (−), an output terminal, a first control terminal, and a second control terminal. The non-inversion input terminal (+) is coupled to the node N1. The inversion input terminal (−) is coupled to the first end of the constant-voltage source VS1. The output terminal is coupled to the gate of the switching element Q1. The first control terminal is coupled to the excessive temperature detection circuit 102. The second control terminal is coupled to the second end of the control circuit CNT. The error amplifier AMP1 brings the switching element Q1 to an on state or an off state based on the signal OVT of the excessive temperature detection circuit 102 and the signal ST of the control circuit CNT.

More specifically, if the signal OVT is at the L level while the voltage VSHARE and the signal ST are at the H level (while the power supply circuit 101 is in an enabled state), the error amplifier AMP1 brings the switching element Q1 to an on state based on the voltage VIN to supply a voltage VOUT greater than the voltage VSS. If the signal OVT is at the H level while the power supply circuit 101 is in an enabled state, the error amplifier AMP1 brings the switching element Q1 to an off state. Also, while the voltage VSHARE and the signal ST are at the L level (while the power supply circuit 101 is in a disabled state), the error amplifier AMP1 brings the switching element Q1 to an off state, regardless of the signal OVT.

With the above-described configuration, the power supply circuit 101 supplies the voltage VOUT to the load 4 based on the voltage VSHARE and the signal OVT.

1. 1. 2. 2 Configuration of Excessive Temperature Detection Circuit and Test Circuit A configuration of the excessive temperature detection circuit 102 and the test circuit 103 according to the embodiment will be described with reference to FIG. 3. FIG. 3 is a circuit diagram illustrating an example of a configuration of the excessive temperature detection circuit and the test circuit according to the embodiment.

A configuration of the excessive temperature detection circuit 102 will be described.

The excessive temperature detection circuit 102 includes a constant current source I1, a diode D1, an operational amplifier AMP2, a resistance R3, and a constant-voltage source VS2. The diode D1 is a PN junction diode.

The constant current source I1 supplies a current to a node N2. The constant current source I1 is driven by, for example, the voltage VIN. The value of the current supplied by the constant current source I1 barely changes with the change in the temperature of the semiconductor device 1.

An anode of the diode D1 is coupled to the node N2. A cathode of the diode D1 is grounded. The diode D1 has, for example, negative temperature characteristics in which the forward voltage decreases with an increase in the temperature.

A first end of the constant-voltage source VS2 is coupled to the resistance R3. A voltage V3 is supplied to the resistance R3 from the first end of the constant-voltage source VS2. A second end of the constant-voltage source VS2 is grounded. The voltage V3 is a voltage that barely changes with the change in the temperature of the semiconductor device 1. The voltage V3 is greater than the voltage VSS.

A first end of the resistance R3 is coupled to the first end of the constant-voltage source VS2. A second end of the resistance R3 is coupled to a node N3. A resistance value of the resistance R3 barely changes with the change in the temperature.

The operational amplifier AMP2 includes a non-inversion input terminal (+), an inversion input terminal (−), and an output terminal. The non-inversion input terminal (+) is coupled to the node N3. The inversion input terminal (−) is coupled to the node N2. The output terminal is coupled to the first control terminal of the error amplifier AMP1 of the power supply circuit 101. A signal OVT is supplied from the output terminal. The operational amplifier AMP2 makes a magnitude comparison between the voltage VN2 (voltage of the inversion input terminal (−)) of the node N2 and the voltage VN3 (voltage of the non-inversion input terminal (−)) of the node N3. If the voltage VN3 is greater than the voltage VN2, an H-level signal OVT is supplied from the output terminal of the operational amplifier AMP2. If the voltage VN3 is equal to or smaller than the voltage VN2, an L-level signal OVT is supplied from the output terminal of the operational amplifier AMP2.

With the above-described configuration, the excessive temperature detection circuit 102 supplies the signal OVT based on a result of the comparison between the voltages VN2 and VN3 to the power supply circuit 101.

It is to be noted that the excessive temperature detection circuit 102 is configured in such a manner that, if the excessive temperature detection circuit 102 and the test circuit 103 are electrically insulated from each other, the voltage VN2 and the voltage VN3 become similar, with the temperature of the semiconductor device 1 being a threshold temperature T1, as will be described later.

A configuration of the test circuit 103 will be described.

The test circuit 103 includes switching elements Q2 and Q3, a resistance R4, constant-voltage sources VS3 and VS4, an operational amplifier AMP3, and an element E1. The switching elements Q2 and Q3 are, for example, N-type MOSFETs.

The element E1 is coupled to the terminal PVSHARE and a node N4. The node N4 is, for example, an interconnect in the test circuit 103. The element E1 may have a conductive state in which electrical coupling is provided between the terminal PVSHARE and the node N4, and an insulated state in which electrical insulation is provided between the terminal PVSHARE and the node N4.

More specifically, the element E1 is, for example, an interconnect pattern of a conductor provided on a semiconductor chip. The conductor contains, for example, polysilicon. The element E1 in a conductive state forms a conductive path that provides electrical coupling between the terminal PVSHARE and the node N4. The element E1 is configured to be melted down by being irradiated with laser light. Thereby, the conductive path between the terminal PVSHARE and the node N4 is physically cut off. That is, the element E1 in a conductive state is irreversibly changed to an element E1 in an insulated state by the melting down of the interconnect pattern through irradiation with laser light.

In the present embodiment, the element E1 is, for example, irreversibly changed from the conductive state to the insulated state. However, the configuration is not limited thereto. The element E1 may be reversibly changed between a conductive state and an insulated state.

A first end of the constant-voltage source VS3 is coupled to the resistance R4. A voltage V4 is supplied to the resistance R4 from the first end of the constant-voltage source VS3. A second end of the constant-voltage source VS3 is grounded.

The first end of the resistance R4 is coupled to the first end of the constant-voltage source VS3. A second end of the resistance R4 is coupled to a node N4. The value of the resistance R4 is set in such a manner that, if the element E1 is in a conductive state, the voltage VN4 of the node N4 becomes similar to the voltage VSHARE.

A first end of the constant-voltage source VS4 is coupled to the operational amplifier AMP3. A voltage V5 is supplied to the operational amplifier AMP3 from the first end of the constant-voltage source VS4. A second end of the constant-voltage source VS4 is grounded. The voltage V5 is a voltage greater than the voltage V4.

The operational amplifier AMP3 includes a non-inversion input terminal (+), an inversion input terminal (−), and an output terminal. The inversion input terminal (−) is coupled to the first end of the constant-voltage source VS4. The non-inversion input terminal (+) is coupled to the node N4. The output terminal is coupled to the switching elements Q2 and Q3. The operational amplifier AMP3 makes a magnitude comparison between the voltage V5 (voltage of the inversion input terminal (−)) supplied from the constant-voltage source VS4 and the voltage VN4 (voltage of the non-inversion input terminal (−)) of the node N4. If the voltage VN4 is greater than the voltage V5, an H-level signal is supplied from the output terminal of the operational amplifier AMP3. If the voltage VN4 is equal to or smaller than the voltage V5, an L-level signal is supplied from the output terminal of the operational amplifier AMP3.

A first end of the switching element Q2 is coupled to the node N2. A gate of the switching element Q2 is coupled to an output terminal of the operational amplifier AMP3. A second end of the switching element Q2 is grounded.

The voltage VIN is supplied to a first end of the switching element Q3 via, for example, the terminal PVIN. A gate of the switching element Q3 is coupled to an output terminal of the operational amplifier AMP3. A second end of the switching element Q3 is coupled to the node N3.

With the above-described configuration, the test circuit 103 brings the switching elements Q2 and Q3 to an on state or an off state based on a result of comparison between a voltage VN4 of the non-inversion input terminal (+) of the operational amplifier AMP3 and a voltage V5 of the inversion input terminal (−) of the operational amplifier AMP3. If the switching element Q2 is in the on state, the voltage VN2 becomes the voltage VSS. If the switching element Q3 is in the on state, the voltage VN3 becomes the voltage VIN. If the switching elements Q2 and Q3 are brought to the off state, the excessive temperature detection circuit 102 and the test circuit 103 are electrically insulated from each other. Thereby, the voltage VN2 depends on the constant current source I1 and the diode D1. Also, the voltage VN3 depends on the constant-voltage source VS2 and the resistance R3.

1. 2 Operation

An operation of the semiconductor device 1 according to the embodiment will be described. The operation of the semiconductor device 1 according to the embodiment includes a test operation and an operation of the semiconductor device 1 after the test operation. In the description that follows, an operation of the semiconductor device 1 after the test operation will be simply referred to as a "normal operation".

Hereinafter, a first operation example in which a semiconductor device 1 including an element E1 in an insulated state is used in a normal operation, and a second operation example in which a semiconductor device 1 including an element E1 in a conductive state is used in a normal operation will be described.

In the first operation example and the second operation example, a test operation is executed by using a semiconductor device 1 including an element E1 in a conductive state.

1. 2. 1 First Operation Example

The first operation example will be described.

In the first operation example, after a test operation is executed, the element E1 is changed from a conductive state to an insulated state prior to a normal operation. The normal operation is executed using a semiconductor device 1 including the element E1 in the insulated state.

1. 2. 1. 1 Test Operation

Figure 4:
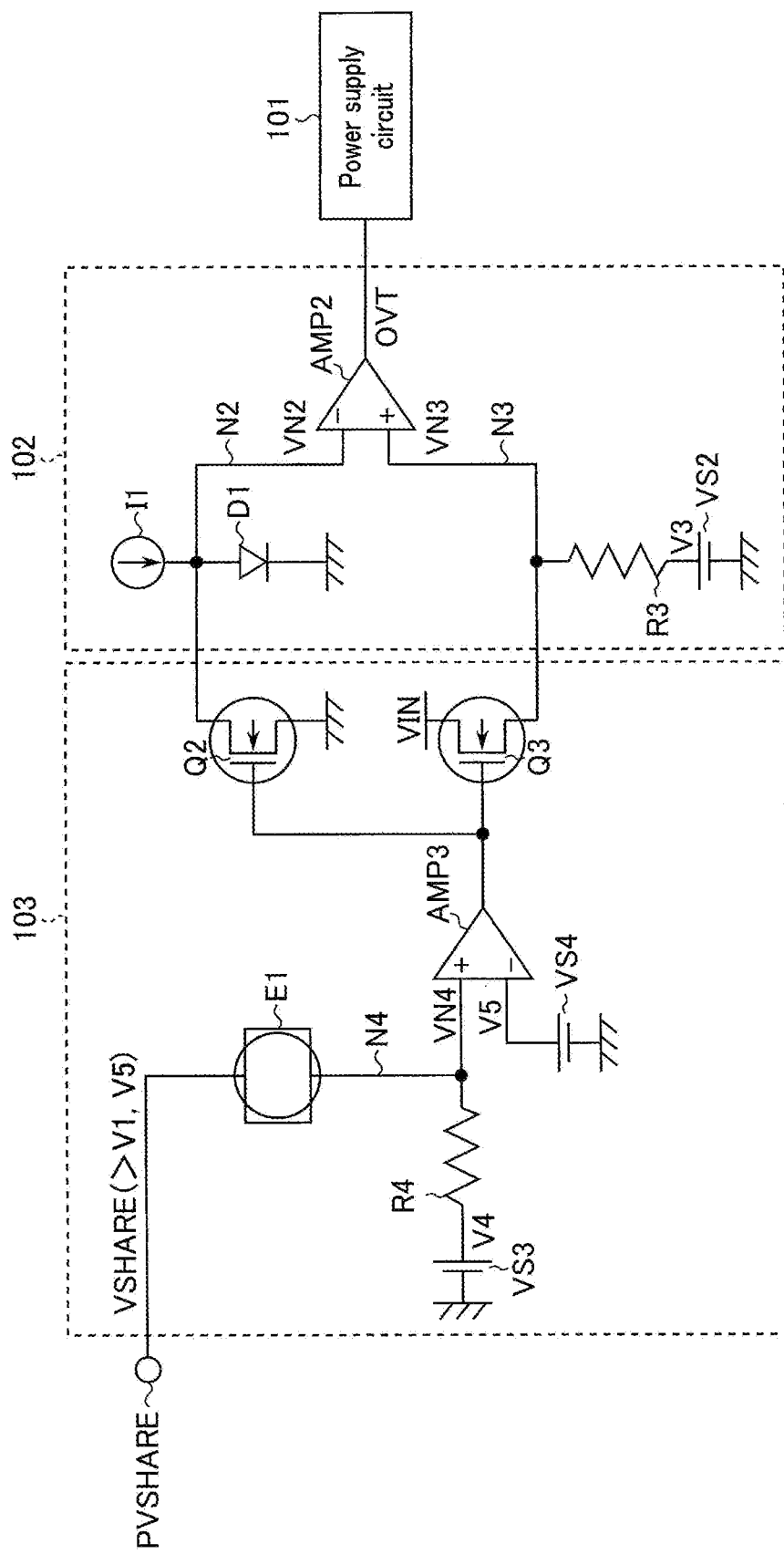
FIG. 4 is a circuit diagram illustrating an example of a configuration of an excessive temperature detection circuit and a test circuit for illustrating a test operation in a first operation example of the embodiment.

The test operation will be described with reference to FIG. 4. FIG. 4 is a circuit diagram illustrating an example of a configuration of an excessive temperature detection circuit and a test circuit for illustrating the test operation according to the embodiment.

The test operation is executed, for example, in an environment in which the temperature of the semiconductor device 1 is similar to the room temperature. The room temperature in the embodiment is lower than a threshold temperature T1. The room temperature in the embodiment is, for example, a temperature on the order of 25° C.

In the test operation, the test circuit 103 supplies a voltage to the voltages VN2 and VN3 in such a manner that the excessive temperature detection circuit 102 pseudo-detects that the temperature of the semiconductor device 1 is equal to or higher than the threshold temperature T1. Upon pseudo-detecting that the temperature of the semiconductor device 1 is equal to or higher than the threshold temperature T1, the excessive temperature detection circuit 102 is determined to be operating in a normal manner. Upon detecting that the temperature of the semiconductor device 1 is lower than the threshold temperature T1, the excessive temperature detection circuit 102 is determined to be broken down.

In the test operation, the element E1 is in a conductive state. In FIG. 4, an "0" mark is appended to the element E1 in the conductive state. Thereby, the node N4 and the terminal PVSHARE are electrically coupled to each other.

In the test operation, a voltage VIN is supplied to the terminal PVIN.

A voltage VSHARE is supplied to the terminal PVSHARE. In the test operation, the voltage VSHARE is an H-level voltage greater than the voltages V1 and V5.

In the test circuit 103, since the element E1 is in the conductive state, the voltage VN4 becomes similar to the voltage VSHARE. Thereby, the voltage VN4 of the non-inversion input terminal (+) of the operational amplifier AMP3 becomes greater than the voltage V5 of the inversion input terminal (−) of the operational amplifier AMP3. By the action of the operational amplifier AMP3, the switching elements Q2 and Q3 are brought to an on state. In FIG. 4, an "o" mark is appended to each of the switching elements Q2 and Q3 in the on state. Accordingly, the node N2 (inversion input terminal (−) of the operational amplifier AMP2) is grounded via the switching element Q2. Also, a voltage VIN is supplied to a node N3 (non-inversion input terminal (+) of the operational amplifier AMP2) via the switching element Q3.

Thus, if the excessive temperature detection circuit 102 is operating in a normal manner, an H-level signal OVT is supplied to the first control terminal of the error amplifier AMP1 from the output terminal of the operational amplifier AMP2. That is, the excessive temperature detection circuit 102 pseudo-detects that the temperature of the semiconductor device 1 is equal to or higher than the threshold temperature T1.

The power supply circuit 101 is brought to an enabled state based on the H-level voltage VSHARE supplied via the terminal PVSHARE. While the power supply circuit 101 is in an enabled state, the error amplifier AMP1 outputs, based on the H-level signal OVT, a voltage similar to the voltage VIN from the output terminal. Thereby, the switching element Q1 is brought to an off state. Accordingly, the voltage VOUT becomes similar to the voltage VSS.

On the other hand, if the excessive temperature detection circuit 102 is broken down, an L-level signal OVT may be supplied from the output terminal of the operational amplifier AMP2 to the first control terminal of the error amplifier AMP1. In this case, the excessive temperature detection circuit 102 cannot pseudo-detect that the temperature of the semiconductor device 1 is equal to or higher than the threshold temperature T1.

In the power supply circuit 101 in the enabled state, the error amplifier AMP1 brings the switching element Q1 to an on state based on the L-level signal OVT supplied from the broken-down excessive temperature detection circuit 102. Thereby, a voltage VOUT greater than the voltage VSS is supplied from the second end of the switching element Q1 based on the voltage VIN.

As is clear from the foregoing, if the voltage VOUT is similar to the voltage VSS in the test operation, the excessive temperature detection circuit 102 is determined to be operating in a normal manner. Also, if the voltage VOUT is greater than, for example, the voltage VSS in the test operation, the excessive temperature detection circuit 102 is determined to be broken down.

With the above-described operation, the test operation ends.

1.2.1.2 Normal Operation

Figure 5:
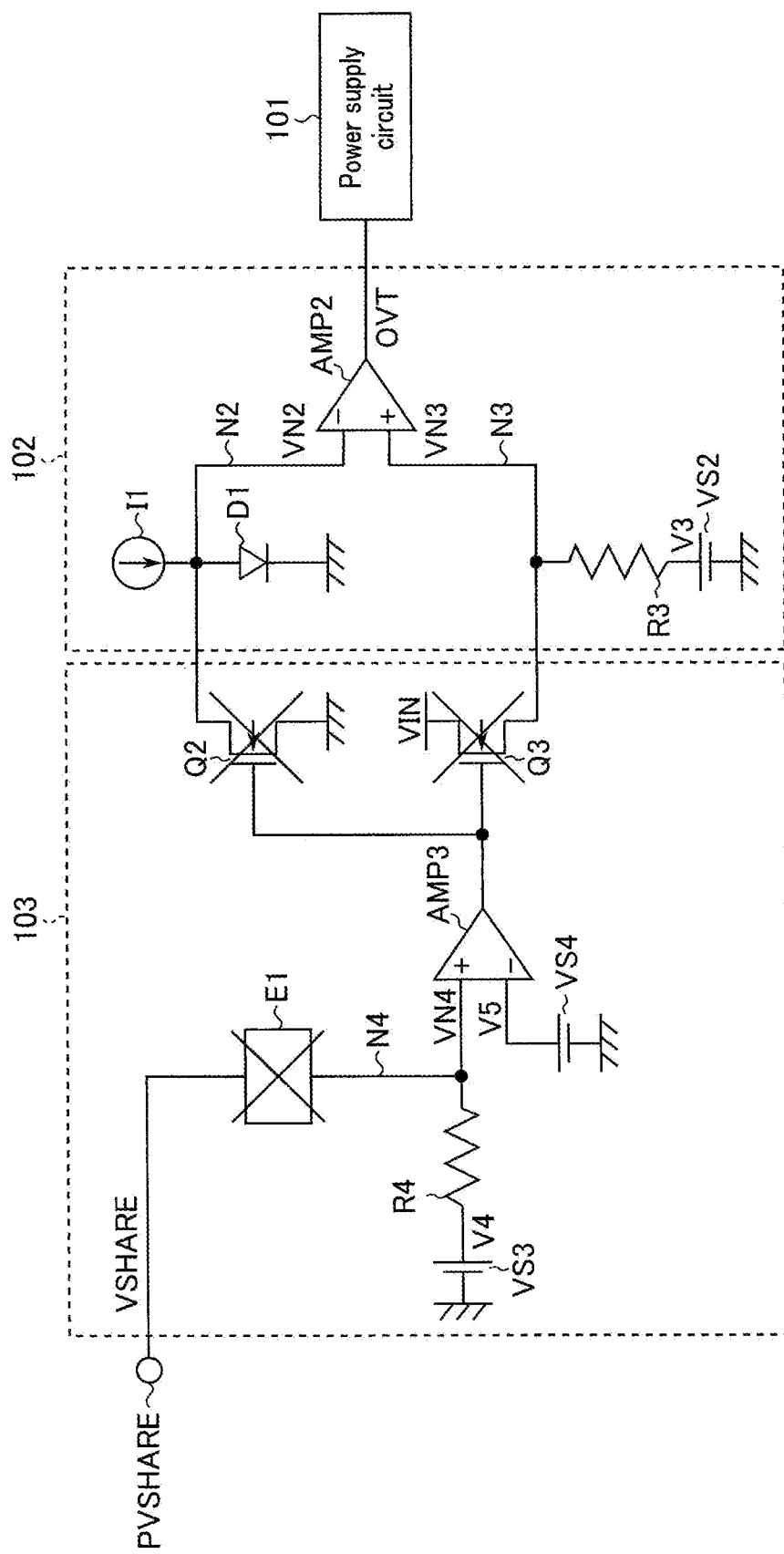
FIG. 5 is a circuit diagram illustrating an example of a configuration of an excessive temperature detection circuit and a test circuit for illustrating a normal operation in the first operation example of the embodiment.
Figure 6:
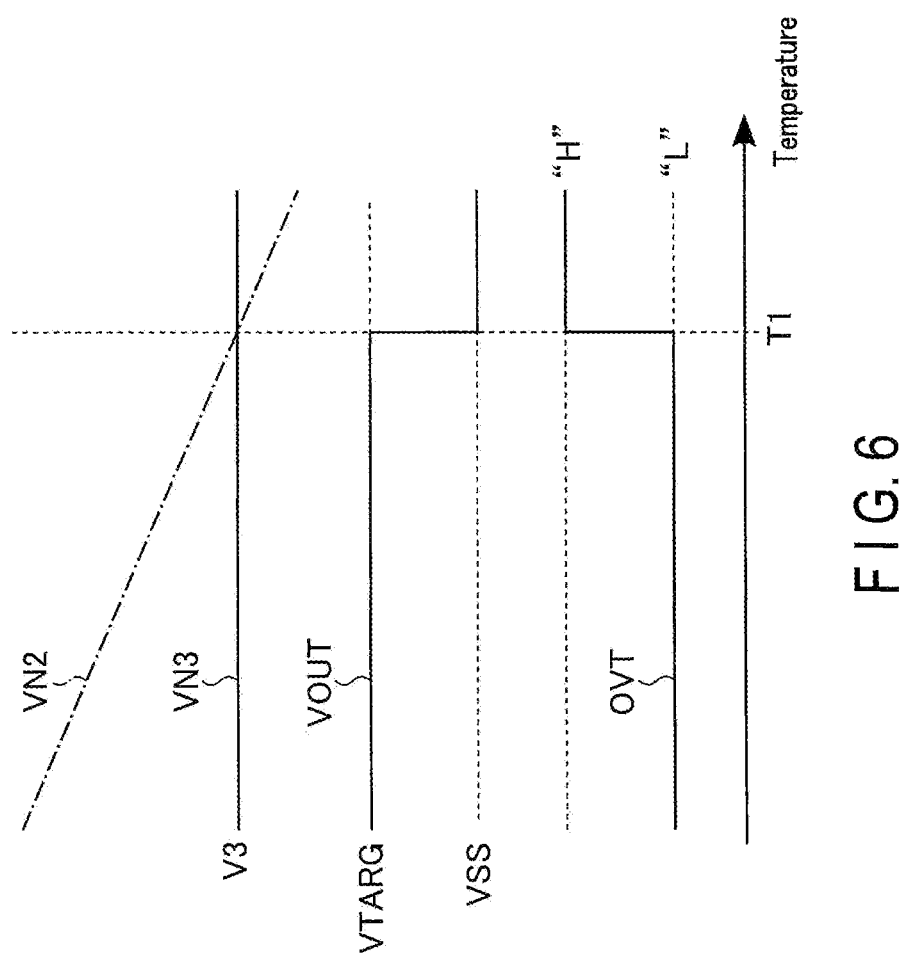
FIG. 6 is a graph illustrating an example of changes in voltages and a signal supplied from the excessive temperature detection circuit with reference to a temperature of the semiconductor device during the normal operation in the first operation example according to the embodiment.

A normal operation will be described with reference to FIGS. 5 and 6. FIG. 5 is a circuit diagram illustrating an example of a configuration of an excessive temperature detection circuit and a test circuit for illustrating the normal operation in the first operation example of the embodiment. FIG. 6 is a graph illustrating an example of changes in voltages VN2 and VN3 and a signal OVT supplied from the excessive temperature detection circuit 102 during the normal operation in the first operation example of the embodiment with reference to the temperature of the semiconductor device 1.

If the semiconductor device is determined to be operating in a normal manner in the test operation, the element E1 is switched from a conductive state to an insulated state prior to the normal operation, as described above. More specifically, the element E1 on the semiconductor chip is irradiated with laser light and melted down. In FIG. 5, an "x" mark is appended to the element E1 in the insulated state.

By the melting down of the element E1, the voltage VN4 becomes similar to the voltage V4 in the test circuit 103. Thereby, the operational amplifier AMP3 brings the switching elements Q2 and Q3 to an off state regardless of the voltage VSHARE. In FIG. 5, an "x" mark is appended to each of the switching elements Q2 and Q3 in an off state.

With the switching element Q2 being in the off state, the voltage VN2 is determined based on the diode D1 and the constant current source I1 in the excessive temperature detection circuit 102. Thereby, as shown in FIG. 6, the voltage VN2 decreases with an increase in the temperature of the semiconductor device 1 due to negative temperature characteristics of the diode D1. With the switching element Q3 being in the off state, the voltage VN3 becomes similar to the voltage V3.

An operation of the case where the power supply circuit 101 is brought to an enabled state will be described.

If the power supply circuit 101 is brought to an enabled state, an H-level voltage is supplied to the terminal PVSHARE.

As shown in FIG. 6, if the temperature of the semiconductor device 1 is lower than the threshold temperature T1, the voltage VN2 will be greater than the voltage VN3. Accordingly, the signal OVT is at an L level. In the power supply circuit 101 in the enabled state, if the signal OVT is at the L level, the error amplifier AMP1 supplies a voltage to the gate of the switching element Q1 in such a manner that the voltage VN1 of the non-inversion input terminal (+) of the error amplifier AMP1 and the voltage V2 of the inversion input terminal (−) of the error amplifier AMP1 become similar. That is, the error amplifier AMP1 supplies a voltage to the gate of the switching element Q1 in such a manner that the voltage VOUT becomes similar to the target voltage VTARG. More specifically, the voltage supplied from the output terminal of the error amplifier AMP1 increases with an increase in the voltage obtained by subtracting the voltage V2 from the voltage VN1. In accordance with the increase in the voltage obtained by subtracting the voltage V2 from the voltage VN1, an on-resistance of the switching element Q1 increases. Thus, the error amplifier AMP1 is configured, if the voltage VOUT is greater than the target voltage VTARG, to output, from the output terminal, a voltage greater than a voltage that is output if the voltage VOUT is similar to the target voltage VTARG. Also, the error amplifier AMP1 is configured, if the voltage VOUT is smaller than the target voltage VTARG, to output, from the output terminal, a voltage smaller than a voltage that is output if the voltage VOUT is similar to the target voltage VTARG. In the above-described manner, the error amplifier AMP1 supplies a voltage to the gate of the switching element Q1 in such a manner that the voltage VOUT that is similar to the target voltage VTARG is supplied to the load 4.

Also, if the temperature of the semiconductor device 1 is equal to or higher than the threshold temperature T1, the voltage VN2 is equal to or smaller than the voltage VN3. Thereby, the signal OVT is brought to an H level. In the power supply circuit 101 in an enabled state, if the signal OVT is at an H level, the error amplifier AMP1 brings the switching element Q1 to an off state, similarly to the test operation. Accordingly, supplying of the voltage VOUT based on the voltage VIN is stopped. That is, the voltage VOUT becomes similar to the voltage VSS.

Next, an operation of the case where the power supply circuit 101 is brought to a disabled state will be described.

If the power supply circuit 101 is brought to a disabled state, an L-level voltage is supplied to the terminal PVSHARE. In the power supply circuit 101 in the disabled state, the error amplifier AMP1 brings the switching element Q1 to an off state, regardless of the signal OVT, similarly to the test operation. Accordingly, supplying of the voltage VOUT based on the voltage VIN is stopped, regardless of the temperature of the semiconductor device 1.

The normal operation is executed in the above-described manner.

1.2.2 Second Operation Example

Next, an operation of the semiconductor device 1 in a second operation example will be described with reference to FIG. 7. FIG. 7 is a circuit diagram illustrating an example of a configuration of an excessive temperature detection circuit and a test circuit for illustrating a normal operation in the second operation example of the embodiment. A test operation in the second operation example is similar to the test operation in the first operation example, and a description thereof will be omitted. The normal operation in the second operation example will be described, mainly with respect to the matters differing from those of the normal operation in the first operation example. In the second operation example, the voltage V5 is greater than the voltage V1.

The normal operation in the second operation example is executed using a semiconductor device including an element E1 in a conductive state, as described above. That is, the element E1 is not melted down after execution of the test operation and prior to execution of the normal operation.

A voltage VSHARE is applied to the terminal PVSHARE. In the normal operation in the second operation example, the voltage VSHARE is equal to or greater than the voltage V1, and smaller than the voltage V5. Thereby, in the test circuit 103, the voltage VN4 becomes smaller than the voltage V5. Accordingly, by the action of the operational amplifier AMP3, the switching elements Q2 and Q3 are constantly brought to an off state, as shown in FIG. 7.

The operation of the power supply circuit 101 and the excessive temperature detection circuit 102 in the normal operation of the second operation example is substantially similar to the operation of the power supply circuit 101 and the excessive temperature detection circuit 102 in the normal operation of the first operation example, and descriptions thereof will be omitted.

Through the above-described normal operation, the semiconductor device 1 is capable of supplying a voltage VOUT to the load 4 based on the temperature of the semiconductor device 1.

1. 3. Advantageous Effects of Embodiment

With the semiconductor device 1 according to the embodiment, it is possible to suppress an increase in the chip size, while suppressing restriction of the voltage level for controlling the power supply.

The semiconductor device 1 of the embodiment includes the terminals PVSHARE, PVIN, and PVOUT, the power supply circuit 101, the excessive temperature detection circuit 102, and the test circuit 103. The power supply circuit 101 is driven based on the voltage VSHARE supplied via the terminal PVSHARE. The excessive temperature detection circuit 102 determines whether or not the temperature of the semiconductor device 1 has increased excessively. In the test circuit 103, an element E1 is provided between the terminal PVSHARE and the node N4. The element E1 is an interconnect pattern of a conductor that may have either a conductive state or an insulated state. The test circuit 103 is configured, if the voltage VN4 of the node N4 has become equal to or greater than the voltage V5 and the temperature of the semiconductor device 1 has increased excessively, to cause the excessive temperature detection circuit 102 to perform pseudo-determination. If the excessive temperature detection circuit 102 determines that the temperature of the semiconductor device 1 has increased excessively, the power supply circuit 101 provides electrical insulation between the terminals PVIN and PVOUT.

In the semiconductor device 1 of the embodiment, the power supply circuit 101 and the test circuit 103 share the terminal PVSHARE. Thereby, it is possible to suppress an increase in the chip size of the semiconductor device 1. In the first operation example of the embodiment, after the test operation is executed, the element E1 is irradiated with laser light and melted down. Thereby, the terminal PVSHARE and the node N4 are electrically insulated from each other. Thus, in the normal operation, with the configuration of the test circuit 103, it is possible to suppress restriction of the level of the voltage VSHARE. With the above-described semiconductor device 1 according to the embodiment, it is possible to suppress an increase in the chip size, while suppressing restriction of the level of the voltage VSHARE supplied in the normal operation.

That is, if a terminal to which a voltage for executing the normal operation is supplied and a terminal to which a voltage for executing the test operation is supplied differ, the number of pads provided on the semiconductor chip increases. This results in the problem of increasing the area of the semiconductor chip. In order to suppress an increase in the number of pads provided on the semiconductor chip, it is desirable to share a terminal to which a voltage for executing the normal operation is supplied and a terminal to which a voltage for executing the test operation is supplied.

However, in the case of sharing the terminal to which the voltage for executing the normal operation is supplied and the terminal to which the voltage for executing the test operation is supplied, the level of the voltage supplied to the terminal in the normal operation may be restricted. More specifically, in the absence of a configuration capable of providing electrical insulation between the test circuit and the terminal, the voltage for executing the normal operation is also supplied to the test circuit. Thereby, in order to suppress execution of the test operation during the normal operation, a range of voltages supplied to the terminal in the test operation and a range of voltages supplied to the terminal in the normal operation are set so as not to overlap each other.

In the embodiment, the test circuit 103 includes the element E1 between the terminal PVSHARE and the node N4. In the first operation example of the embodiment, since the element E1 is melted down prior to execution of the normal operation after the test operation, the test circuit 103 and the excessive temperature detection circuit 102 can be electrically insulated from each other. Thereby, even in the case of sharing the terminal to which the voltage for executing the normal operation is supplied and the terminal to which the voltage for executing the test operation is supplied, it is possible to suppress execution of the test operation during the normal operation. Accordingly, it is possible to suppress an increase in the chip size, while suppressing restriction of the level of the voltage VSHARE in the normal operation.

With the semiconductor device 1 of the embodiment, it is possible to execute the normal operation, even if the element E1 does not provide electrical insulation between the terminal PVSHARE and the node N4 as in the second operation example of the embodiment.

2. Modifications

Next, a description will be given of a semiconductor device according to modifications. Hereinafter, a description of a configuration and an operation similar to those of the above-described embodiment will be omitted, and a description will be given mainly of a configuration and an operation different from those of the above-described embodiment.

2. 1 First Modification

In the above-described embodiment, an example has been shown in which the element E1 is configured to be melted down by being irradiated with laser light; however, the configuration is not limited thereto. The element E1 may be configured, for example, to be melted down based on a current flowing through the element E1. Hereinafter, a configuration and an operation of a semiconductor device 1 according to a first modification will be described, mainly with respect to the matters differing from the embodiment.

A configuration of the semiconductor device 1 according to the first modification will be described with reference to FIG. 8. FIG. 8 is a circuit diagram illustrating an example of a configuration of an excessive temperature detection circuit and a test circuit according to the first modification.

A test circuit 103 of the first modification includes switching elements Q2, Q3, Q4, Q5 and Q6, a resistance R4, constant-voltage sources VS3 and VS4, an operational amplifier AMP3, and an element E1. The switching elements Q4, Q5, and Q6 are, for example, N-type MOSFETs. A configuration of the switching elements Q2 and Q3, the resistance R4, the constant-voltage sources VS3 and VS4, and the operational amplifier AMP3 is similar to the configuration of the switching elements Q2 and Q3, the resistance R4, the constant-voltage sources VS3 and VS4, and the operational amplifier AMP3 in the embodiment.

A first end of the switching element Q4 is coupled to a terminal PVSHARE. A second end of the switching element Q4 is coupled to a node N5. A signal S is supplied to a gate of the switching element Q4. The signal S is an H-level or an L-level signal. An on-voltage of the switching element Q4 is a voltage greater than the L-level signal S and equal to or smaller than the H-level signal S.

A first end of the switching element Q5 is coupled to the terminal PVIN. A second end of the switching element Q5 is coupled to the node N5. A signal /S is supplied to a gate of the switching element Q5. The signal /S is an inversion signal of the signal S. An on-voltage of the switching element Q5 is, for example, similar to the on-voltage of the switching element Q4.

A first end of the switching element Q6 is grounded. A second end of the switching element Q6 is coupled to a node N4. A signal /S is supplied to a gate of the switching element Q6. An on-voltage of the switching element Q6 is, for example, similar to the on-voltage of the switching element Q4 and the on-voltage of the switching element Q5.

The element E1 is coupled to the nodes N4 and N5. The element E1 may have either a conductive state in which electrical coupling is provided between the nodes N4 and N5, or an insulated state in which electrical insulation is provided between the nodes N4 and N5. The interconnect pattern of the element E1 is configured to be melted down based on a current flowing through the interconnect pattern. More specifically, the element E1 is configured, for example, to be melted down if the current flowing through the element E1 is equal to or greater than a first current value over a predetermined first period. The first current value is set so as to be greater than, for example, the value of a current flowing through the interconnect pattern in the test operation. With such a configuration, the element E1 is configured to irreversibly change from a conductive state to an insulated state by physically cutting the interconnect pattern between the nodes N4 and N5.

A configuration of a power supply circuit 101 and an excessive temperature detection circuit 102 in the first modification is similar to the configuration of the power supply circuit 101 and the excessive temperature detection circuit 102 in the embodiment.

An operation of the semiconductor device 1 according to the first modification will be described.

In a test operation in the first operation example of the first modification, the signal S is brought to an H level. Thereby, the switching element Q4 is brought to an on state. Also, the signal /S is brought to an L level. Thereby, the switching elements Q5 and Q6 are brought to an off state. The test operation in the first operation example of the first modification is substantially similar to the test operation in the first operation example of the embodiment, except for the operation of the switching elements Q4, Q5, and Q6.

In the first operation example of the first modification, the signal S is brought to an L level at an interval between the test operation and a normal operation. Thereby, the switching element Q4 is brought to an off state. Also, the signal /S is brought to an H level. Thereby, the switching elements Q5 and Q6 are brought to an on state. Also, a current of a value equal to or greater than the first current value flows through the element E1 via the terminal PVIN over a first period. Thereby, the element E1 is melted down.

The element E1 is, for example, melted down in a semiconductor chip in which the semiconductor device 1 is not sealed by an insulator; however, the configuration is not limited thereto. The element E1 may be melted down in a package in which the semiconductor device 1 is sealed by an insulator.

In the normal operation in the first operation example of the first modification, the signal S is brought to an H level. Also, the signal /S is brought to an L level. The normal operation in the first operation example of the first modification is substantially similar to the normal operation in the first operation example of the embodiment, except for the operation of the switching elements Q4, Q5, and Q6.

A test operation in the second operation example of the first modification is similar to the test operation in the first operation example of the first modification.

Signals S and /S supplied in a normal operation in the second operation example of the first modification are similar to the signals S and /S supplied in the normal operation in the first operation example of the first modification. The normal operation in the second operation example of the first modification is substantially similar to the normal operation in the second operation example of the embodiment, except for the operation of the switching elements Q4, Q5, and Q6.

The first modification produces advantageous effects similar to those of the above-described embodiment.

In the first modification, an example has been shown in which the element E1 is melted down by a current flowing through the element E1 via the terminal PVIN, at an interval between the test operation and the normal operation in the first operation example of the first modification. However, the configuration is not limited thereto. The element E1 may be configured to be melted down by a current flowing through the element E1 via the terminal PVSHARE. In this case, a signal S, for example, is supplied to the gate of the switching element Q6.

2. 2 Second Modification

In the above-described embodiment, a case has been shown where the test circuit 103 includes the switching elements Q2 and Q3; however, the configuration is not limited thereto. The test circuit 103 may include only one of the switching elements Q2 and Q3. Hereinafter, a configuration and an operation of a semiconductor device according to a second modification will be described, mainly with respect to the matters differing from the configuration and the operation of the semiconductor device according to the embodiment.

A configuration of a semiconductor device 1 according to the second modification will be further described with reference to FIG. 9. FIG. 9 is a circuit diagram illustrating an example of a configuration of an excessive temperature detection circuit and a test circuit according to the second modification.

The test circuit 103 shown in FIG. 9 includes a switching element Q3, a resistance R4, constant-voltage sources VS3 and VS4, an operational amplifier AMP3, and an element E1. That is, the test circuit 103 includes only the switching element Q3, of the switching elements Q2 and Q3 in the embodiment. A configuration of the switching element Q3, the resistance R4, the constant-voltage sources VS3 and VS4, the operational amplifier AMP3, and the element E1 is similar to the configuration of the switching element Q3, the resistance R4, the constant-voltage sources VS3 and VS4, the operational amplifier AMP3, and the element E1 of the test circuit 103 in the embodiment.

A configuration of a power supply circuit 101 and an excessive temperature detection circuit 102 in the second modification is similar to the configuration of the power supply circuit 101 and the excessive temperature detection circuit 102 in the embodiment.

In FIG. 9, an example has been shown in which the test circuit 103 includes the switching element Q3; however, the configuration is not limited thereto. A test circuit 103 in the second modification may include only a switching element Q2, of the switching elements Q2 and Q3. In this case, the test circuit 103 includes a switching element Q2, a resistance R4, constant-voltage sources VS3 and VS4, an operational amplifier AMP3, and an element E1. A configuration of the switching element Q2, the resistance R4, the constant-voltage sources VS3 and VS4, the operational amplifier AMP3, and the element E1 is similar to the configuration of the switching element Q2, the resistance R4, the constant-voltage sources VS3 and VS4, the operational amplifier AMP3, and the element E1 of the test circuit 103 in the embodiment.

The operation of the semiconductor device 1 in the second modification is substantially similar to the operation of the semiconductor device 1 in the embodiment, and a description thereof will be omitted.

The second modification produces advantageous effects similar to those of the above-described embodiment.

2. 3 Third Modification

According to the above-described embodiment and the first and second modifications, a case has been described where an interconnect pattern that is melted down is used as the element E1; however, the configuration is not limited thereto. A switching element may be used as the element E1. Hereinafter, a configuration and an operation of a semiconductor device according to a third modification will be described, mainly with respect to the matters differing from the configuration and the operation of the semiconductor device 1 according to the embodiment.

Figure 10:
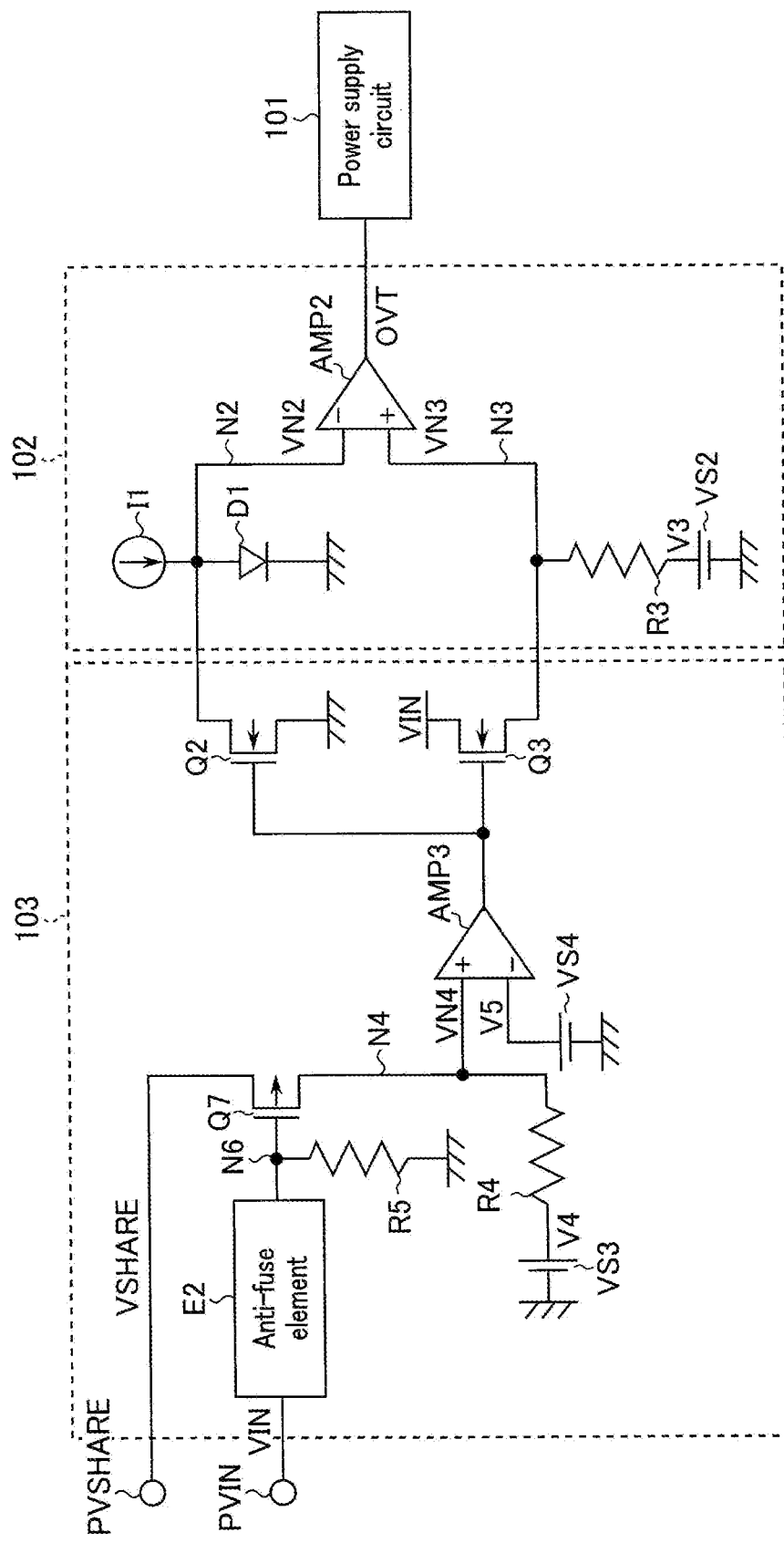
FIG. 10 is a circuit diagram illustrating an example of a configuration of an excessive temperature detection circuit and a test circuit according to a third modification.

A configuration of a semiconductor device 1 according to the third modification will be further described with reference to FIG. 10. FIG. 10 is a circuit diagram illustrating an example of a configuration of an excessive temperature detection circuit and a test circuit according to the third modification.

A test circuit 103 of the third modification includes switching elements Q2, Q3, and Q7, resistances R4 and R5, constant-voltage sources VS3 and VS4, an operational amplifier AMP3, and an anti-fuse element E2. The switching element Q7 is, for example, a P-type MOSFET. A configuration of the switching elements Q2 and Q3, the resistance R4, the constant-voltage sources VS3 and VS4, and the operational amplifier AMP3 is similar to the configuration of the switching elements Q2 and Q3, the resistance R4, the constant-voltage sources VS3 and VS4, and the operational amplifier AMP3 of the test circuit 103 in the embodiment.

The anti-fuse element E2 includes, for example, a first end coupled to a terminal PVIN, and a second end coupled to a node N6. The anti-fuse element E2 changes from an insulated state in which electrical insulation is provided between the first end and the second end to a conductive state in which electrical coupling is provided between the first end and the second end. More specifically, the anti-fuse element E2 in an insulated state includes an insulating film that provides electrical insulation between the first end and the second end. The anti-fuse element E2 is configured to be irreversibly changed from an insulated state to a conductive state by a breakdown of the insulating film as a result of an increase in the voltage of a portion between the first end and the second end. The insulating film is broken down when, for example, a voltage equal to or greater than a predetermined magnitude is supplied to, for example, the first end of the anti-fuse element E2. This voltage is greater than a voltage VIN in the normal operation.

A first end of the resistance R5 is coupled to the node N6. A second end of the resistance R5 is grounded.

A first end of the switching element Q7 is coupled to the terminal PVSHARE. A gate of the switching element Q7 is coupled to the node N6. A second end of the switching element Q7 is coupled to the node N4. The on state of the switching element Q7 is a conductive state in which the terminal PVSHARE and the node N4 are electrically coupled. The off state of the switching element Q7 is an insulated state in which the terminal PVSHARE and the node N4 are electrically insulated. That is, the switching element Q7 is an element that may reversibly change its state between a conductive state and an insulated state. The on-voltage of the switching element Q7 is, for example, a voltage smaller than the voltage VIN in the normal operation.

With the above-described configuration, if the insulating film of the anti-fuse element E2 is not broken down, a voltage VSS is supplied to the gate of the switching element Q7. Thereby, the switching element Q7 is brought to an on state. Also, if the insulating film of the anti-fuse element E2 is broken down, the voltage VIN is supplied to the gate of the switching element Q7 via the anti-fuse element E2. Thereby, if the voltage VIN in the normal operation is supplied to the gate of the switching element Q7, the switching element Q7 is brought to an off state.

A configuration of a power supply circuit 101 and an excessive temperature detection circuit 102 in the third modification is similar to the configuration of the power supply circuit 101 and the excessive temperature detection circuit 102 in the embodiment.

An operation of a semiconductor device 3 according to the third modification will be described.

In a test operation in a first operation example of the third modification, a voltage VIN is set to a level at which an insulating film of the anti-fuse element E2 is not broken down. Thereby, the switching element Q7 is brought to an on state. The test operation in the first operation example of the third modification is substantially similar to the test operation in the first operation example of the embodiment, except that the switching element Q7 is in an on state.

In the first operation example of the third modification, the insulating film of the anti-fuse element E2 is broken down by supply of the voltage VIN via the terminal PVIN at an interval between the test operation and a normal operation. Thereby, the voltage VIN is supplied to the gate of the switching element Q7 via the anti-fuse element E2.

The insulating film of the anti-fuse element E2 is broken down in a semiconductor chip in which the semiconductor device 1 is not sealed by an insulator; however, the configuration is not limited thereto. The insulating film of the anti-fuse element E2 may be broken down in a package in which the semiconductor device 1 is sealed by an insulator.

In the normal operation in the first operation example of the third modification, the switching element Q7 is brought to an off state by supply of the voltage VIN to the gate of the switching element Q7. The normal operation is substantially similar to the normal operation in the first operation example of the embodiment, except that the switching element Q7 is in an off state.

A test operation in a second operation example of the third modification is similar to the test operation in the first operation example of the third modification.

A normal operation in the second operation example of the third modification is substantially similar to the normal operation in the second operation example of the embodiment, except that the switching element Q7 is in an on state.

The third modification produces advantageous effects similar to those of the above-described embodiment and the first and second modifications.

2. 4 Fourth Modification

In the third modification, a case has been shown where the switching element Q7 is brought to an on state or an off state by an insulating-film-breakdown-type fuse element; however, the configuration is not limited thereto. The switching element Q7 may be configured to be brought to an on state or an off state by a non-volatile memory. Hereinafter, a configuration and an operation of a semiconductor device according to a fourth modification will be described, mainly with respect to the matters differing from the configuration and the operation of the semiconductor device 1 according to the third modification.

Figure 11:
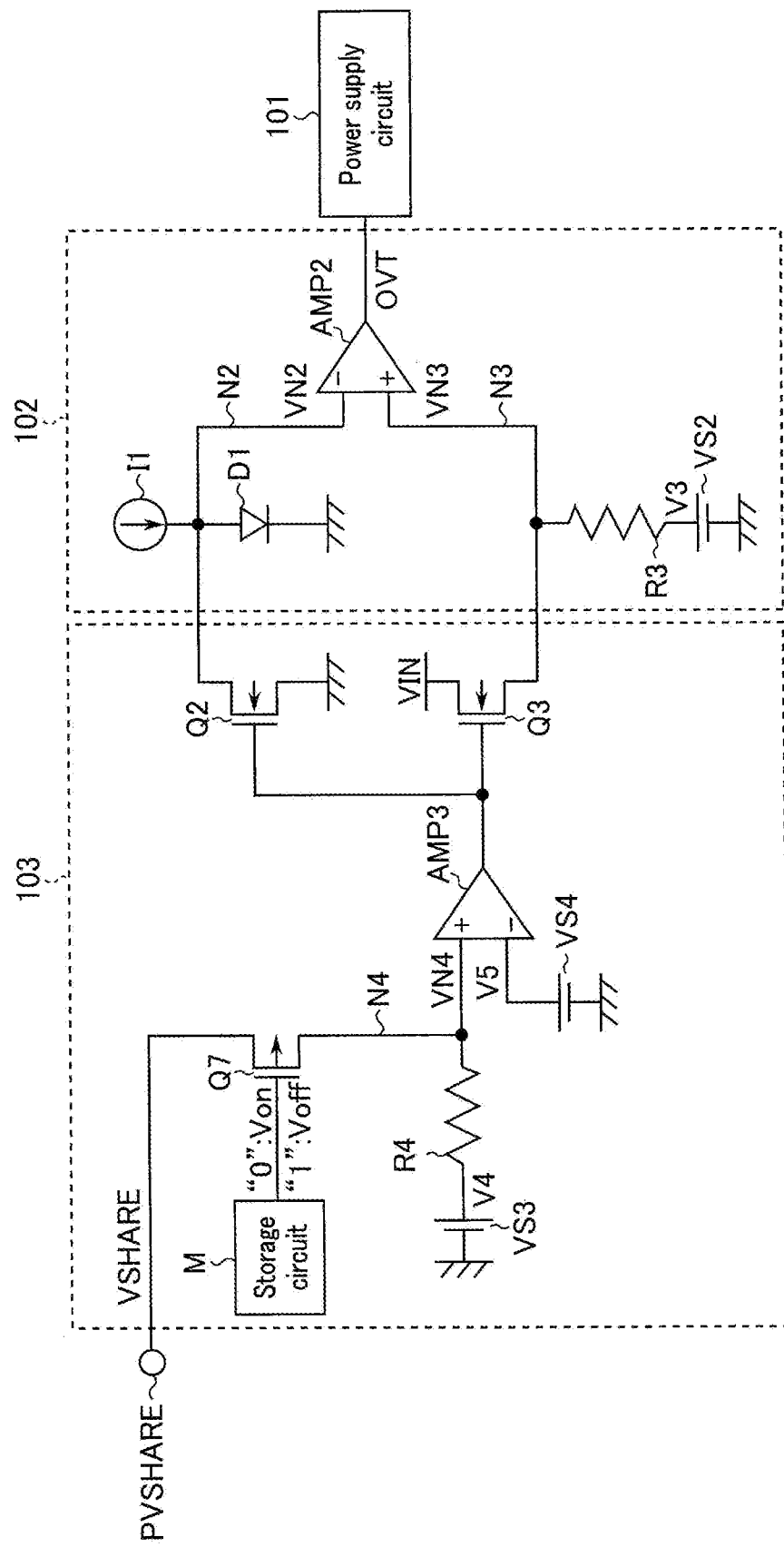
FIG. 11 is a circuit diagram illustrating an example of a configuration of an excessive temperature detection circuit and a test circuit according to a fourth modification.

A configuration of a semiconductor device 1 according to the fourth modification will be described with reference to FIG. 11. FIG. 11 is a circuit diagram illustrating an example of a configuration of an excessive temperature detection circuit and a test circuit according to the fourth modification.

A test circuit 103 of the fourth modification includes switching elements Q2, Q3 and Q7, a resistance R4, constant-voltage sources VS3 and VS4, an operational amplifier AMP3, and a storage circuit M. A configuration of the switching elements Q2, Q3, and Q7, the resistance R4, the constant-voltage sources VS3 and VS4, and the operational amplifier AMP3 in the fourth modification is similar to a configuration of the switching elements Q2, Q3 and Q7, the resistance R4, the constant-voltage sources VS3 and VS4, and the operational amplifier AMP3 of the test circuit 103 in the third modification.

In the fourth modification, the storage circuit M includes a first memory cell. The first memory cell is, for example, an element included in an electrically erasable programmable read-only memory (EEPROM™), a one-time programmable (OTP) memory, or a flash memory. The first memory cell stores "0" data (denoted by "0" in FIG. 11) or "1" data (denoted by "1" in FIG. 11). The storage circuit M is configured in such a manner, for example, that data in the first memory cell can be rewritten by an internal or external circuit in the semiconductor device 1. The storage circuit M is configured to supply a voltage Von to the gate of the switching element Q7 if the first memory cell stores "0" data (denoted by ""0": Von" in FIG. 11). The voltage Von is a voltage of a magnitude equal to or smaller than the on-voltage of the switching element Q7. Also, the storage circuit M is configured to supply a voltage Voff to the gate of the switching element Q7 if the first memory element stores "1" data (denoted by ""1": Voff" in FIG. 11). The voltage Voff is a voltage greater than the on-voltage of the switching element Q7.

An operation of the semiconductor device 4 according to the first modification will be described.

In a test operation in a first operation example of the fourth modification, the first memory element stores "0" data. Thereby, the voltage Von is supplied to the gate of the switching element Q7. Thereby, the switching element Q7 is brought to an on state. The test operation in the first operation example of the fourth modification is substantially similar to the test operation in the first operation example of the third modification.

In the first operation example of the fourth modification, after the test operation and prior to the normal operation, data in the first memory element is rewritten from "0" data to "1" data. Thereby, the voltage Voff is supplied to the gate of the switching element Q7. Accordingly, the switching element Q7 is brought to an off state in the normal operation.

A normal operation in the first operation example of the fourth modification is similar to the normal operation in the first operation example of the third modification, except that the first memory element stores data.

A test operation in a second operation example of the fourth modification is similar to the test operation in the first operation example of the fourth modification.

A normal operation in the second operation example of the fourth modification is similar to the test operation in the second operation example of the third modification, except that the first memory element stores "0" data.

The fourth modification produces advantageous effects similar to those of the above-described embodiment and the first to third modifications.

2. 5 Fifth Modification

In the above-described embodiment and the first to fourth modifications, a case has been described where the power supply circuit 101 is brought to an enabled state based on the H-level voltage VSHARE and is brought to a disabled state based on the L-level voltage VSHARE; however, the configuration is not limited thereto. The power supply circuit 101 may be brought to an enabled state based on the L-level voltage VSHARE, and brought to a disabled state based on the H-level voltage VSHARE. Hereinafter, a configuration and an operation of a semiconductor device according to a fifth modification will be described, mainly with respect to the matters differing from the configuration and the operation of the semiconductor device according to the embodiment.

2. 5. 1 Configuration

A power supply circuit 101 according to the fifth modification includes a switching element Q1, resistances R1 and R2, an error amplifier AMP1, a constant-voltage source VS1, and a control circuit CNT. A configuration of the switching element Q1, the resistances R1 and R2, the error amplifier AMP1, and the constant-voltage source VS1 is similar to the configuration of the switching element Q1, the resistances R1 and R2, the error amplifier AMP1, and the constant-voltage source VS1 according to the above-described embodiment.

In the fifth modification, the control circuit CNT supplies an H-level signal ST to the error amplifier AMP1 to bring the power supply circuit 101 to an enabled state while the voltage VSHARE is at the L level (while the voltage VSHARE is smaller than the voltage V1). Also, the control circuit CNT supplies an L-level signal ST to the error amplifier AMP1 to bring the power supply circuit 101 to a disabled state while the voltage VSHARE is at the H level.

A configuration of an excessive temperature detection circuit 102 and a test circuit 103 according to the fifth modification will be described with reference to FIG. 12.

FIG. 12 is a circuit diagram illustrating an example of a configuration of an excessive temperature detection circuit and a test circuit according to the fifth modification.

The test circuit 103 includes switching elements Q2 and Q3, a resistance R4, constant-voltage sources VS3 and VS4, an operational amplifier AMP3, and an element E1. A configuration of the switching elements Q2 and Q3, the resistance R4, the constant-voltage sources VS3 and VS4, and the element E1 is similar to the configuration of the switching elements Q2 and Q3, the resistance R4, the constant-voltage sources VS3 and VS4, and the element E1 in the embodiment.

In the fifth, modification, an inversion input terminal (−) of the operational amplifier AMP3 is coupled to a node N4. The non-inversion input terminal (+) of the operational amplifier AMP3 is coupled to the first end of the constant-voltage source VS4.

In the fifth modification, a voltage V4 supplied from a constant-voltage source VS3 is greater than a voltage V5 supplied from a constant-voltage source VS4.

A configuration of the excessive temperature detection circuit 102 in the fifth modification is similar to the configuration of the excessive temperature detection circuit 102 in the embodiment.

2. 5. 2 Operation

First and second operation examples of the fifth modification will be described, mainly with respect to the matters differing from the first and second operation examples of the above-described embodiment.

2. 5. 2. 1 First Operation Example

A test operation and a normal operation in the first operation example of the fifth modification will be described, with respect to the matters differing from the test operation and the normal operation of the first operation example in the embodiment.

In the test operation, the voltage VSHARE is smaller than the voltages V1 and V5. Thereby, in the test circuit 103, the switching elements Q2 and Q3 are brought to an on state by the action of the operational amplifier AMP3.

The power supply circuit 101 is brought to an enabled state based on the L-level voltage VSHARE.

The other operations in the test operation of the first operation example of the fifth modification are substantially similar to the test operation of the first operation example of the embodiment, and a description thereof will be omitted.

In the normal operation, if the power supply circuit 101 is brought to an enabled state, an L-level voltage VSHARE is supplied to the terminal PVSHARE.

If the power supply circuit 101 is brought to a disabled state, an H-level voltage VSHARE is supplied to the terminal PVSHARE.

The other operations in the normal operation of the first operation example of the fifth modification are substantially similar to those in the normal operation of the first operation example of the embodiment, and a description thereof will be omitted.

2. 5. 2. 2 Second Operation Example

A test operation and a normal operation in the second operation example of the fifth modification will be described, with respect to the matters differing from the test operation and the normal operation in the second operation example in the embodiment. In the second operation example, the voltage V1 is greater than the voltage V5.

The test operation in the second operation example in the fifth modification is similar to the test operation in the first operation example of the fifth modification, and a description thereof will be omitted.

In the normal operation, the element E1 is in a conductive state, similarly to the normal operation in the second operation example of the embodiment.

The voltage VSHARE supplied to the terminal PVSHARE is greater than the voltage V5 and smaller than the voltage V1. Thereby, the voltage VN4 of the inversion input terminal (−) of the operational amplifier AMP3 becomes greater than the voltage V5 of the non-inversion input terminal (+) of the operational amplifier AMP3. By the action of the operational amplifier AMP3, the switching elements Q2 and Q3 are brought to an off state.

The other operations in the normal operation of the second operation example of the fifth modification are substantially similar to those in the normal operation of the second operation example of the embodiment, and a description thereof will be omitted.

The fifth modification produces advantageous effects similar to those of the above-described embodiment and the first to fourth modifications.

2. 6 Sixth Modification

In the above-described embodiment and the first to fifth modifications, a case has been described where the power supply circuit 101 is an LDO regulator; however, the configuration is not limited thereto. The power supply circuit 101 may be a load switch. Hereinafter, a configuration and an operation of a semiconductor device according to a sixth modification will be described, mainly with respect to the matters differing from the configuration and the operation of the semiconductor device according to the embodiment.

Figure 13:
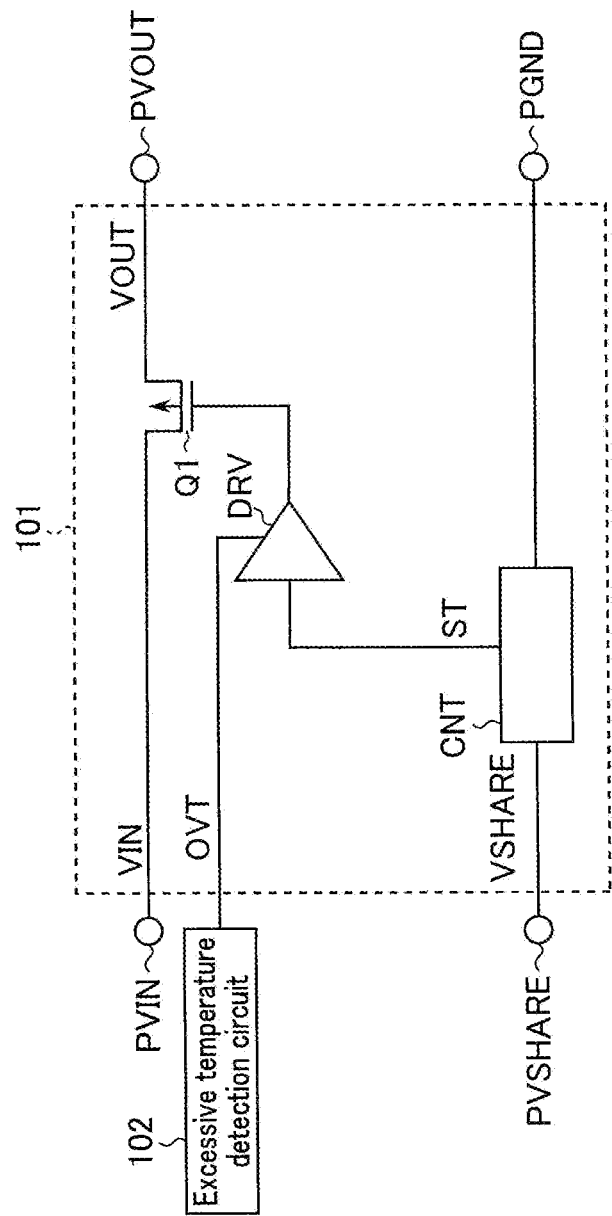
FIG. 13 is a circuit diagram illustrating an example of a configuration of a power supply circuit according to a sixth modification.

A configuration of the power supply circuit 101 will be described with reference to FIG. 13. FIG. 13 is a circuit diagram illustrating an example of a configuration of a power supply circuit according to the sixth modification.

The power supply circuit 101 includes a switching element Q1, a driver DRV, and a control circuit CNT. As described above, the power supply circuit 101 is a load switch.

A gate of the switching element Q1 is coupled to the driver DRV.

A second end of the control circuit CNT is coupled to the driver DRV. A signal ST based on the voltage VSHARE is supplied to the driver DRV from the second end.

The driver DRV includes a first control terminal, a second control terminal, and an output terminal. The first control terminal is coupled to the excessive temperature detection circuit 102. The second control terminal is coupled to the second end of the control circuit CNT. The output terminal is coupled to the gate of the switching element Q1. The driver DRV brings the switching element Q1 to an on state or an off state based on the signal OVT of the excessive temperature detection circuit 102 and the signal ST of the control circuit CNT.

More specifically, if the signal OVT is at the L level while the voltage VSHARE and the signal ST are at the H level (while the power supply circuit 101 is in an enabled state), the driver DRV brings the switching element Q1 to the on state based on the voltage VIN to supply a voltage VOUT greater than the voltage VSS. If the signal OVT is at the H level while the power supply circuit 101 is in an enabled state, the driver DRV brings the switching element Q1 to an off state. Also, while the voltage VSHARE and the signal ST are at the L level (while the power supply circuit 101 is in a disabled state), the driver DRV brings the switching element Q1 to an off state, regardless of the signal OVT.

With the above-described configuration, the power supply circuit 101 supplies the voltage VOUT to the load 4 based on the voltage VSHARE and the signal OVT.

The operation of a semiconductor device 1 according to the sixth modification is substantially similar to the operation of the semiconductor device according to the embodiment, and a description thereof will be omitted.

The sixth modification produces advantageous effects similar to those of the above-described embodiment and the first to fifth modifications.

2. 7 Seventh Modification

In the above-described embodiment and the first to sixth modifications, a case has been described where the power supply circuit 101 is an LDO regulator and a load switch; however, the configuration is not limited thereto. The power supply circuit 101 may be included in a DC-DC converter. Hereinafter, a configuration and an operation of a semiconductor device according to a seventh modification will be described, mainly with respect to the matters differing from the configuration and the operation of the semiconductor device according to the embodiment.

2. 7. 1 Power Supply System

A configuration of a power supply system including the semiconductor device according to the embodiment will be described with reference to FIG. 14. FIG. 14 is a block diagram showing an example of a configuration of a power supply system including the semiconductor device according to the seventh modification. The power supply system includes a semiconductor device 1, a power source 2, a drive circuit 3, a load 4, and a filter circuit 5.

The semiconductor device 1 includes terminals PGND, PVIN, PVSHARE, PVSW, and PFB.

The terminal PVSW is coupled to the filter circuit 5. A voltage VSW is supplied from the terminal PVSW to the filter circuit 5. The voltage VSW is a voltage used for generating the voltage VOUT. The filter circuit 5 performs a smoothing process on the voltage VSW supplied from the semiconductor device 1. The filter circuit 5 supplies the voltage VOUT generated by the smoothing process to the load 4.

The terminal PFB is coupled to the filter circuit 5. The voltage VOUT is supplied to the terminal PFB from the filter circuit 5.

2. 7. 2 Semiconductor Device

A configuration of the semiconductor device 1 according to the seventh modification will be further described with reference to FIG. 14.

The power supply circuit 101 is coupled to the excessive temperature detection circuit 102 and the terminals PVIN, PVSHARE, PVSW, PFB, and PGND. A signal OVT is supplied to the power supply circuit 101 from the excessive temperature detection circuit 102. The voltage VSHARE is supplied to the power supply circuit 101 via the terminal PVSHARE. The power supply circuit 101 is brought to an enabled state while the voltage VSHARE is at an H level. The H-level voltage VSHARE is, for example, equal to or greater than the voltage V1. The voltage VOUT is supplied to the power supply circuit 101 via the terminal PFB. The power supply circuit 101 in an enabled state supplies the voltage VSW to the filter circuit 5 based on the voltage VIN, based on the signal OVT from the excessive temperature detection circuit 102 and the voltage VOUT from the filter circuit 5. The power supply circuit 101 is brought to a disabled state while the voltage VSHARE is at an L level. The power supply circuit 101 in the disabled state stops supplying the voltage VSW based on the voltage VIN, regardless of the signal OVT from the excessive temperature detection circuit 102 and the voltage VOUT from the filter circuit 5.

A configuration of the excessive temperature detection circuit 102 and the test circuit 103 is similar to the configuration of the excessive temperature detection circuit 102 and the test circuit 103 according to the embodiment. Hereinafter, a description will be given mainly of the configuration of the power supply circuit 101.

2. 7. 3 Power Supply Circuit

A configuration of the power supply circuit 101 and the filter circuit 5 will be described with reference to FIG. 15. FIG. 15 is a circuit diagram illustrating an example of a configuration of a power supply circuit and a filter circuit according to the seventh modification. In the seventh modification, a power supply circuit 101 and a filter circuit 5 configure a DC-DC converter.

The power supply circuit 101 includes switching elements Q1 and Q8, a driver DRV, and a control circuit CNT. The switching element Q8 is an N-type MOSFET.

The gate of the switching element Q1 is coupled to the driver DRV. A second end of the switching element Q1 is coupled to the terminal PVSW.

A first end of the switching element Q8 is coupled to the terminal PVSW. A gate of the switching element Q8 is coupled to the driver DRV. A second end of the switching element Q8 is coupled to the terminal PGND.

A second end of the control circuit CNT is coupled to the driver DRV. A signal ST based on the voltage VSHARE is supplied to the driver DRV from the second end of the control circuit CNT.

The driver DRV includes a first control terminal, a second control terminal, a third control terminal, a first output terminal, and a second output terminal. The first control terminal is coupled to the excessive temperature detection circuit 102. The second control terminal is coupled to the second end of the control circuit CNT. The third control terminal is coupled to the terminal PFB. The first output terminal is coupled to the gate of the switching element Q1. The second output terminal is coupled to the gate of the switching element Q8. The driver DRV brings the switching elements Q1 and Q8 to an on state or an off state based on the signal OVT of the excessive temperature detection circuit 102, the signal ST of the control circuit CNT, and the voltage VOUT.

More specifically, if the signal OVT is at the L level while the power supply circuit 101 is in an enabled state, the driver DRV brings the switching element Q1 to an on state and brings the switching element Q8 to an off state in a second period. Thereby, in the second period, the voltage VSW becomes a voltage based on the voltage VIN. In a third period, the driver DRV brings the switching element Q1 to an off state, and brings the switching element Q8 to an on state. Thereby, the terminal PVSW is grounded. The driver DRV respectively supplies voltages to the gate of the switching element Q1 and the gate of the switching element Q8 in such a manner that the second period, the third period, the second period, and so on follow in this order. If, for example, the voltage VOUT is smaller than the target voltage VTARG, the driver DRV makes the proportion of the second period to the third period great. If, for example, the voltage VOUT is equal to the target voltage VTARG, the driver DRV maintains the proportion of the second period to the third period. If, for example, the voltage VOUT is greater than the target voltage VTARG, the driver DRV makes the proportion of the second period to the third period small. Thereby, the waveform of the voltage VSW is changed. If the signal OVT is at the H level while the power supply circuit 101 is in an enabled state, the driver DRV brings the switching element Q1 to an off state, and brings the switching element Q8 to an on state. While the power supply circuit 101 is in a disabled state, the driver DRV brings the switching element Q1 to an off state and brings the switching element Q8 to an on state, regardless of the signal OVT.

With the above-described configuration, the power supply circuit 101 supplies the voltage VSW to the filter circuit 5 based on the voltages VSHARE and VOUT and the signal OVT.

The filter circuit 5 includes an inductor L and a capacitor C.

A first end of the inductor L is coupled to the terminal PVSW. A second end of the inductor L is coupled to the terminal PFB. The terminal PFB is coupled to the load 4.

A first end of the capacitor C is coupled to the terminal PFB. A second end of the capacitor C is grounded.

With the above-described configuration, the filter circuit 5 performs smoothing of the waveform of the voltage VSW supplied from the semiconductor device 1. Thereby, the filter circuit 5 generates a voltage VOUT similar to the target voltage VTARG using the voltage VSW.

The operation of the semiconductor device 1 according to the seventh modification is substantially similar to the operation of the semiconductor device according to the embodiment, and a description thereof will be omitted.

The seventh modification produces advantageous effects similar to those of the above-described embodiment and the first to sixth modifications.

3. Others

In the above-described embodiment and its modifications, a case has been described where the semiconductor device 1 includes the excessive temperature detection circuit 102 and the test circuit 103 as separate circuits; however, the configuration is not limited thereto. In the semiconductor device 1, the configuration of the excessive temperature detection circuit 102 and the configuration of the test circuit 103, for example, may be included in a single circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first terminal;
a second terminal;
a third terminal;
a first circuit configured to output a first signal of a first level if a temperature satisfies a condition; and
a second circuit driven based on a voltage supplied to the first terminal and configured to provide electrical insulation between the second terminal and the third terminal if the first circuit outputs the first signal of the first level, wherein
the first circuit includes an element provided between a first interconnect and the first terminal,
the first circuit outputs the first signal of the first level regardless of the temperature if a first voltage is supplied to the first interconnect, and
the element is configured to change irreversibly from a conductive state in which electrical coupling is provided between the first interconnect and the first terminal to an insulated state in which electrical insulation is provided between the first interconnect and the first terminal.

2. The device of claim 1, wherein
the element is a conductor configured to be melted down by being irradiated with laser light.

3. The device of claim 1, wherein
the element is a conductor configured to be melted down if a value of a current flowing through the element becomes equal to or greater than a first current value.

4. The device of claim 3, wherein
the first circuit further includes:
a first transistor coupled to the first terminal and the element; and
a second transistor coupled to the second terminal and a node between the first transistor and the element, and
a signal supplied to a gate of the first transistor is an inversion signal of a signal supplied to a gate of the second transistor.

5. The device of claim 1, wherein
the first circuit further includes an anti-fuse element including a first end to which a voltage is supplied and a second end coupled to the element,
the anti-fuse element provides electrical coupling between the first end and the second end if a second voltage is supplied to the first end, and
the element is brought to the insulated state based on the second voltage supplied via the first end and the second end.

6. The device of claim 1, wherein
the first circuit further includes a storage element capable of storing data, and
the element is brought to the insulated state based on the data.

7. The device of claim 1, wherein
the first circuit outputs the first signal of the first level if the temperature is equal to or higher than a first temperature,
the first circuit further includes:
a first operational amplifier including: a non-inversion input terminal coupled to the first interconnect; an inversion input terminal to which a second voltage is supplied;
and an output terminal; and
a load coupled to the non-inversion input terminal, and the first circuit is configured to output the first signal of the first level based on an output from the output terminal of the first operational amplifier if a voltage of the non-inversion input terminal of the first operational amplifier is greater than the second voltage.

8. A semiconductor device comprising:
a first terminal;
a second terminal;
a third terminal;
a first circuit configured to output a first signal of a first level if a temperature satisfies a condition; and
a second circuit driven based on a voltage supplied to the first terminal and configured to provide electrical insulation between the second terminal and the third terminal if the first circuit outputs the first signal of the first level, wherein
the first circuit includes an element provided between a first interconnect and the first terminal,
the first circuit outputs the first signal of the first level regardless of the temperature if a first voltage is supplied to the first interconnect,
the first circuit further includes:
    a first operational amplifier including: a non-inversion input terminal coupled to the first interconnect; an inversion input terminal to which a second voltage is supplied; and an output terminal; and
    a load coupled to the non-inversion input terminal,
the first circuit is configured to output the first signal of the first level based on an output from the output terminal of the first operational amplifier if a voltage of the non-inversion input terminal of the first operational amplifier is greater than the second voltage,
the first circuit further includes:
    a first current source;
    a diode including an anode to which a current is supplied from the first current source;
    a second operational amplifier including: an inversion input terminal coupled to the anode of the diode; a non-inversion input terminal to which a third voltage is supplied; and an output terminal via which the first signal is output to the second circuit, the second operational amplifier being configured to output the first signal of the first level if the third voltage is greater than a voltage of the inversion input terminal of the second operational amplifier, and
the first circuit is further configured in such a manner that the third voltage becomes greater than the voltage of the inversion input terminal of the second operational amplifier based on an output from the output terminal of the first operational amplifier if the voltage of the non-inversion input terminal of the first operational amplifier is greater than the second voltage.

9. A semiconductor device comprising:
a first terminal;
a second terminal;
a third terminal;
a first circuit configured to output a first signal of a first level if a temperature satisfies a condition; and
a second circuit driven based on a voltage supplied to the first terminal and configured to provide electrical insulation between the second terminal and the third terminal if the first circuit outputs the first signal of the first level, wherein
the first circuit includes an element provided between a first interconnect and the first terminal,
the first circuit outputs the first signal of the first level regardless of the temperature if a first voltage is supplied to the first interconnect,
the first circuit includes:
    a first operational amplifier including: a non-inversion input terminal to which a second voltage is supplied; an inversion input terminal coupled to the first interconnect; and an output terminal; and
    a load coupled to the inversion input terminal, and
the first circuit is configured to output the first signal of the first level based on an output from the output terminal of the first operational amplifier if a voltage of the inversion input terminal of the first operational amplifier is smaller than the second voltage.

10. The device of claim 9, wherein
the first circuit includes:
    a first current source;
    a diode including an anode to which a current is supplied from the first current source;
    a second operational amplifier including: an inversion input terminal coupled to the anode of the diode; a non-inversion input terminal to which a third voltage is supplied; and an output terminal via which the first signal is output to the second circuit, the second operational amplifier being configured to output the first signal of the first level if the third voltage is greater than a voltage of the inversion input terminal of the second operational amplifier, and
the first circuit is configured in such a manner that the third voltage becomes greater than the voltage of the inversion input terminal of the second operational amplifier based on an output from the output terminal of the first operational amplifier if the voltage of the inversion input terminal of the first operational amplifier is smaller than the second voltage.

11. A semiconductor device comprising:
a first terminal;
a second terminal;
a third terminal;
a first circuit configured to output a first signal of a first level if a temperature satisfies a condition; and
a second circuit driven based on a voltage supplied to the first terminal and configured to provide electrical insulation between the second terminal and the third terminal if the first circuit outputs the first signal of the first level, wherein
the first circuit includes an element that is provided between a first interconnect and the first terminal and configured to change irreversibly from a conductive state in which electrical coupling is provided between the first interconnect and the first terminal to an insulated state in which electrical insulation is provided between the first interconnect and the first terminal,
the first circuit outputs the first signal of the first level regardless of the temperature if a first voltage is supplied to the first interconnect,
the second circuit includes a first transistor coupled to the second terminal and the third terminal,
the second circuit is configured in such a manner that the first transistor is configured to be brought to an on state or an off state based on the first signal and the voltage of the first terminal,
the second circuit further includes an error amplifier including: a non-inversion input terminal coupled to the third terminal; an inversion input terminal to which a second voltage is supplied; an output terminal coupled to a gate of the first transistor; a first input terminal to which the first signal is supplied; and a second input terminal to which a second signal based on the voltage of the first terminal is supplied, and the error amplifier is configured to bring the first transistor to the on state or the off state based on the first signal and the second signal.

12. A semiconductor device comprising:
a first terminal;
a second terminal;
a third terminal;
a first circuit configured to output a first signal of a first level if a temperature satisfies a condition; and
a second circuit driven based on a voltage supplied to the first terminal and configured to provide electrical insulation between the second terminal and the third terminal if the first circuit outputs the first signal of the first level, wherein
the first circuit includes an element that is provided between a first interconnect and the first terminal and configured to change irreversibly from a conductive state in which electrical coupling is provided between the first interconnect and the first terminal to an insulated state in which electrical insulation is provided between the first interconnect and the first terminal,
the first circuit outputs the first signal of the first level regardless of the temperature if a first voltage is supplied to the first interconnect,
the second circuit includes a first transistor coupled to the second terminal and the third terminal,
the second circuit is configured in such a manner that the first transistor is configured to be brought to an on state or an off state based on the first signal and the voltage of the first terminal, and
the second circuit is configured to:
bring the first transistor to the on state if the voltage of the first terminal is at a second level and the first signal is at a level different from the first level; and
bring the first transistor to the off state if the first signal is at the first level or the voltage of the first terminal is at a level different from the second level.

* * * * *